(12) United States Patent
Chen et al.

(10) Patent No.: US 11,950,456 B2
(45) Date of Patent: Apr. 2, 2024

(54) ARRAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yipeng Chen, Beijing (CN); Ling Shi, Beijing (CN); Wenqiang Li, Beijing (CN); Shuai Xie, Beijing (CN); Yang Yu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 426 days.

(21) Appl. No.: 17/437,936

(22) PCT Filed: Oct. 27, 2020

(86) PCT No.: PCT/CN2020/124163
§ 371 (c)(1),
(2) Date: Sep. 10, 2021

(87) PCT Pub. No.: WO2022/087851
PCT Pub. Date: May 5, 2022

(65) Prior Publication Data
US 2022/0328589 A1    Oct. 13, 2022

(51) Int. Cl.
*H10K 59/121*    (2023.01)
*H10K 59/131*    (2023.01)

(52) U.S. Cl.
CPC ....... *H10K 59/1213* (2023.02); *H10K 59/131* (2023.02)

(58) Field of Classification Search
CPC .............. H10K 59/1213; H10K 59/131; H01L 27/1225; G09G 3/3266; G11C 19/28
See application file for complete search history.

(56) References Cited

U.S. PATENT DOCUMENTS 7,091,936 B1    8/2006  Yamada
10,186,187 B2    1/2019  Tsai et al.
(Continued)

FOREIGN PATENT DOCUMENTS

CN    103257497 A    8/2013
CN    103296090 A    9/2013
(Continued)

OTHER PUBLICATIONS

Written Opinion for International Application No. PCT/CN2020/124163 dated Jul. 29, 2021.

*Primary Examiner* — J. E. Schoenholtz
(74) *Attorney, Agent, or Firm* — Perilla Knox & Hildebrandt LLP; Kenneth A. Knox

(57) ABSTRACT

This disclosure provides an array substrate and a display device. In the array substrate, the pixel driving circuit includes a driving transistor, a first transistor and a second transistor. The driving transistor and the first transistor are P-type transistors, and the second transistor is N-type transistor. The array substrate also includes a base substrate, and a first conductive layer arranged at a side of the base substrate and including: a first conductive portion forming a gate electrode of the driving transistor; a first gate line at a side of the first conductive portion, a part of the first gate line being configured to form a gate electrode of the first transistor; and a second gate line at a side of the first gate line away from the first conductive portion, a part of the second gate line being configured to form a first gate electrode of the second transistor.

20 Claims, 11 Drawing Sheets

(56) References Cited

U.S. PATENT DOCUMENTS

| | | | |
|---|---|---|---|
| 10,460,673 B2* | 10/2019 | Gao | G09G 3/3291 |
| 10,916,198 B2* | 2/2021 | Lin | G09G 3/3258 |
| 11,651,736 B2* | 5/2023 | Lin | H10K 59/1213 |
| | | | 345/691 |
| 2015/0034950 A1 | 2/2015 | Miyazawa et al. | |
| 2016/0275845 A1 | 9/2016 | Tsai et al. | |
| 2018/0166025 A1* | 6/2018 | Zhou | G09G 3/3233 |
| 2019/0096327 A1* | 3/2019 | Peng | G09G 3/3241 |
| 2020/0035157 A1 | 1/2020 | Jeong | |
| 2023/0326396 A1* | 10/2023 | Kawashima | H10K 50/00 |

FOREIGN PATENT DOCUMENTS

| | | |
|---|---|---|
| CN | 107710318 A | 2/2018 |
| CN | 108735779 A | 11/2018 |
| CN | 108986747 A | 12/2018 |
| CN | 109817645 A | 5/2019 |
| CN | 110808012 A | 2/2020 |
| CN | 110993613 A | 4/2020 |
| CN | 111009218 A | 4/2020 |
| CN | 111128874 A | 5/2020 |
| CN | 210575036 U | 5/2020 |
| CN | 111369941 A | 7/2020 |
| CN | 111369943 A | 7/2020 |
| CN | 111477669 A | 7/2020 |
| CN | 111724736 A | 9/2020 |
| CN | 110808012 B | 2/2021 |
| WO | 2016148759 A1 | 9/2016 |

* cited by examiner

ARRAY SUBSTRATE AND DISPLAY DEVICE

CROSS-REFERENCE TO RELATED APPLICATION

The present application is a national phase application under 35 U.S.C. § 371 of International Application No. PCT/CN2020/124163 filed Oct. 27, 2020, the contents of which being incorporated by reference in their entireties herein.

TECHNICAL FIELD

The present disclosure relates to a display technical field, in particular, to an array substrate and a display device.

BACKGROUND

In the related art, a pixel driving circuit may be formed by using the low temperature polycrystalline oxide (LTPO) technology, and the LTPO technology forms the pixel driving circuit by combining an N-type metal oxide transistor and a P-type low temperature polysilicon transistor. However, in the pixel driving circuit formed by the low temperature polycrystalline oxide technology, when the N-type metal oxide transistor is turned off, it will pull down a gate electrode of the driving transistor, thus affecting the charging of the gate electrode of the driving transistor.

It should be noted that information disclosed in this part are provided only for acquiring a better understanding of the background of the present application and therefore may include information that is not current technology already known to those of ordinary skill in the art.

SUMMARY

According to one aspect of the present disclosure, an array substrate is provided. The array substrate includes a pixel driving circuit and a data line. The pixel driving circuit includes a driving transistor, a first transistor connected between a first electrode of the driving transistor and the data line, and a second transistor connected between a gate and a second electrode of the driving transistor. The driving transistor and the first transistor are P-type transistors, and the second transistor is a N-type transistor. The array substrate also includes a base substrate and a first conductive layer. The first conductive layer is arranged at a side of the base substrate and includes a first conductive portion, a first gate line and a second gate line. The first conductive portion is configured to form a gate electrode of the driving transistor. The first gate line is located at a side of the first conductive portion, and a part of the first gate line is configured to form a gate electrode of the first transistor. The second gate line is located at a side of the first gate line away from the first conductive portion, and a part of the second gate line is configured to form a first gate electrode of the second transistor.

In an exemplary embodiment of the present disclosure, the first gate line is at a side of the first conductive portion in a first direction and extends along a second direction, the first direction and the second direction intersect with each other, and the first gate line includes a first extending portion and a second extending portion. An orthographic projection of the first extending portion on the base substrate is opposite to an orthographic projection of at least a part of the first conductive portion on the base substrate in the first direction. An orthographic projection of the second extending portion on the base substrate is offset from an orthographic projection of the first conductive portion on the base substrate in the first direction.

In an exemplary embodiment of the present disclosure, a distance between the orthographic projection of the first extending portion on the base substrate and the orthographic projection of the first conductive portion on the base substrate in the first direction is smaller than a distance between the orthographic projection of the second extending portion on the base substrate and the orthographic projection of the first conductive portion on the base substrate in the first direction.

In an exemplary embodiment of the present disclosure, the first extending portion includes a third edge at a side facing the first conductive portion, the first conductive portion includes a fourth edge at a side facing the first extending portion, and a size of an orthographic projection of the third edge on the base substrate in the second direction is equal to a size of an orthographic projection of the fourth edge on the base substrate in the second direction.

In an exemplary embodiment of the present disclosure, at least a part of the second extending portion is configured to form the gate electrode of the first transistor.

In an exemplary embodiment of the present disclosure, the array substrate includes a plurality of pixel driving circuits, the first conductive layer includes a plurality of first conductive portions distributed at intervals along the second direction, and the first conductive portions are configured to respectively form gate electrodes of driving transistors in different pixel driving circuits. The first gate line includes a plurality of first extending portions and a plurality of second extending portions. The first extending portions are arranged corresponding to the first conductive portions one by one, and an orthographic projection of one of the first extending portions on the base substrate is opposite to at least a part of an orthographic projection of a corresponding first conductive portion on the base substrate in the first direction. The second extending portions are connected between adjacent first extending portions.

In an exemplary embodiment of the present disclosure, the array substrate further includes a second conductive layer arranged at a side of the first conductive layer facing away from the base substrate. The second conductive layer includes: a second conductive portion, an orthographic projection of the second conductive portion on the base substrate being at least partially overlapped with the orthographic projection of the first conductive portion on the base substrate, and the second conductive portion being electrically connected with the first conductive portion through a via hole; a third conductive portion for forming a first electrode of the second transistor, an orthographic projection of the first gate line on the base substrate being between the orthographic projection of the second conductive portion on the base substrate and an orthographic projection of the third conductive portion on the base substrate; a first conductive line connected between the second conductive portion and the third conductive portion, an orthographic projection of the first conductive line on the base substrate intersecting with the orthographic projection of the first gate line on the base substrate.

In an exemplary embodiment of the present disclosure, the second conductive layer further includes a fourth conductive portion connected with the first conductive line. An orthographic projection of the fourth conductive portion on the base substrate is at least partially overlapped with the orthographic projection of the first gate line on the base substrate. The fourth conductive portion includes a first edge, the first conductive line includes a second edge connected with the first edge of the fourth conductive portion, and an angle between an orthographic projection of the first edge on the base substrate and an orthographic projection of the second edge on the base substrate is less than 180 degrees.

In an exemplary embodiment of the present disclosure, the orthographic projection of the fourth conductive portion on the base substrate is at least partially overlapped with the orthographic projection of the first extending portion on the base substrate.

In an exemplary embodiment of the present disclosure, an orthographic projection of the second gate line on the base substrate is between the orthographic projection of the first gate line on the base substrate and the orthographic projection of the third conductive portion on the base substrate. The second gate line includes a third extending portion and a fourth extending portion which are sequentially and alternately connected in the second direction, and a size of an orthographic projection of the third extending portion on the base substrate in the first direction is smaller than a size of an orthographic projection of the fourth extending portion on the base substrate in the first direction. The orthographic projection of the first conductive line on the base substrate intersects with the orthographic projection of the third extending portion on the base substrate.

In an exemplary embodiment of the present disclosure, a part of the fourth extending portion is configured to form the first gate electrode of the second transistor.

In an exemplary embodiment of the present disclosure, the second conductive layer further includes a power line extending along the first direction. The array substrate also includes a third conductive layer arranged at a side of the second conductive layer facing away from the base substrate.

In an exemplary embodiment of the present disclosure, the power line includes a fifth extending portion, and an orthographic projection of the fifth extending portion on the base substrate is opposite to the orthographic projection of at least a part of the first conductive portion on the base substrate in the second direction. The third conductive layer includes the data line extending along the first direction, and an orthographic projection of a part of the data line on the base substrate is on the orthographic projection of the fifth extending portion on the base substrate.

In an exemplary embodiment of the present disclosure, the third conductive layer includes a fifth conductive portion connected to the power line through a via hole. An orthographic projection of the fifth conductive portion on the base substrate covers the orthographic projection of the first conductive portion on the base substrate, and the orthographic projection of the fifth conductive portion on the base substrate covers the orthographic projection of the second conductive portion on the base substrate.

In an exemplary embodiment of that present disclosure, the array substrate further includes a third transistor. A first electrode of the third transistor is connected with a gate electrode of the driving transistor, and the second transistor and the third transistor are N-type metal oxide transistors. The first conductive layer further includes a third gate line at a side of the second gate line away from the first conductive portion and extending along the second direction, and a part of the third gate line is configured to form a gate electrode of the third transistor. The third conductive layer includes a fifth conductive portion connected to the power line through a via hole, and an orthographic projection of the fifth conductive portion on the base substrate covers an orthographic projection of the second transistor on the base substrate and an orthographic projection of the third transistor on the base substrate.

In an exemplary embodiment of the present disclosure, the array substrate includes a R pixel driving circuit, a G pixel driving circuit and a B pixel driving circuit. A width-length ratio of a channel region of the driving transistor in the R pixel driving circuit, a width-length ratio of a channel region of the driving transistor in the G pixel driving circuit, and a width-length ratio of a channel region of the driving transistor in the B pixel driving circuit are not all the same.

In an exemplary embodiment of the present disclosure, the width-length ratio of the channel region of the driving transistor in the R pixel driving circuit is equal to the width-length ratio of the channel region of the driving transistor in the G pixel driving circuit, and is smaller than the width-length ratio of the channel region of the driving transistor in the B pixel driving circuit.

In an exemplary embodiment of the present disclosure, the width-length ratio of the channel region of the driving transistor in the R pixel driving circuit is 3.5/40, and the width-length ratio of the channel region of the driving transistor in the B pixel driving circuit is 3.5/25.

In an exemplary embodiment of the present disclosure, the array substrate further includes a fourth conductive layer laminated between the first conductive layer and the second conductive layer. The fourth conductive layer includes a fourth gate line extending along the second direction. The orthographic projection of the first gate line on the base substrate is between the orthographic projection of the first conductive portion on the base substrate and an orthographic projection of the fourth gate line on the base substrate, and a part of the fourth gate line is configured to form a second gate electrode of the second transistor.

In an exemplary embodiment of the present disclosure, the fourth gate line includes a sixth extending portion part and a seventh extending portion part which are alternately and sequentially connected along the second direction. A size of an orthographic projection of the sixth extending portion on the base substrate in the first direction is smaller than a size of an orthographic projection of the seventh extending portion on the base substrate in the first direction. The orthographic projection of the first conductive line on the base substrate intersects with the orthographic projection of the sixth extending portion on the base substrate.

In an exemplary embodiment of the present disclosure, a part of the seventh extending portion is configured to form the second gate electrode of the second transistor.

In an exemplary embodiment of the present disclosure, the array substrate further includes a first active layer and a second active layer. The first active layer laminated between the base substrate and the first conductive layer, and a part of the first active layer is configured to form a channel region of the driving transistor. The second active layer laminated between the fourth conductive layer and the first conductive layer, and a part of the second active layer is configured to form a channel region of the second transistor.

In an exemplary embodiment of the present disclosure, the array substrate further includes an enable signal line, an initial signal line, an anode layer, a first reset signal line, a second reset signal line and a power line. The pixel driving circuit further includes a third transistor, a fourth transistor, a fifth transistor, a sixth transistor, and a capacitor. The third transistor has a first electrode connected to the gate electrode of the driving transistor, a second electrode connected to the initial signal line, and a gate electrode connected to the second reset signal line. The fourth transistor has a first electrode connected to the power line, a second electrode connected to the first electrode of the driving transistor, and a gate electrode connected to the enable signal line. The fifth transistor has a first electrode connected to the second electrode of the driving transistor, a second electrode connected to the anode layer, and a gate electrode connected to the enable signal line. The sixth transistor has a first electrode connected to the second electrode of the fifth transistor, a second electrode connected to the initial signal line, and a gate electrode connected to the first reset signal line. The capacitor is connected between the gate electrode of the driving transistor and the power line.

In an exemplary embodiment of the present disclosure, the driving transistor, the fourth transistor, the fifth transistor and the sixth transistor are P-type low-temperature polysilicon transistors.

According to one aspect of the present disclosure, a display device is provided. The display device includes the array substrate described above.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Understandably, the drawings in the following description are only for illustrating some embodiments of the present disclosure and those of ordinary skill in the art can also derive other drawings based on the drawings without paying any creative labor.

DETAILED DESCRIPTION

Figure 1:
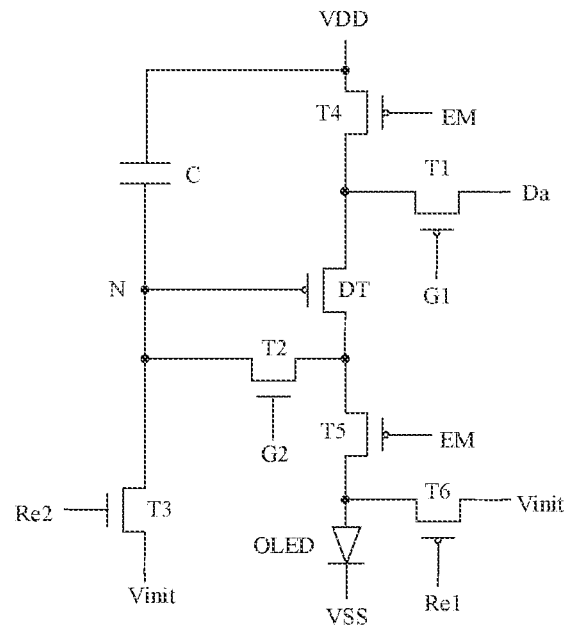
FIG. 1 is a schematic circuit structure diagram of a pixel driving circuit of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. Same reference numbers denote the same or similar structures in the figures, and thus the detailed description thereof will be omitted.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. Other relative terms, such as "high", "low", "top", "bottom", "left" and "right" have similar meanings. When a structure is described as "above" another structure, it probably means that the structure is integrally formed on another structure, or, the structure is "directly" arranged on another structure, or, the structure is "indirectly" arranged on another structure through an additional structure.

Words such as "one", "an/a", "the", and "said" are used herein to indicate the presence of one or more elements/component parts/and others. Terms "including", "comprising," and "having" have an inclusive meaning which means that there may be additional elements/component parts/and others in addition to the listed elements/component parts/and others.

FIG. 1 is a schematic circuit structure diagram of a pixel driving circuit of the present disclosure. The pixel driving circuit may include a driving transistor DT, a first transistor T1, a second transistor T2, a third transistor T3, a fourth transistor T4, a fifth transistor T5, a sixth transistor T6, and a capacitor C. The first transistor T1 has a first electrode connected to a data signal terminal Da, a second electrode connected to the first electrode of the driving transistor DT, and a gate electrode connected to a first gate driving signal terminal G1. The fourth transistor T4 has a first electrode connected to a first power terminal VDD, a second electrode connected to the first electrode of the driving transistor DT, and a gate electrode connected to an enable signal terminal EM. The driving transistor DT has a gate electrode connected to a node N and a second electrode connected to a first electrode of the fifth transistor T5. The second transistor T2 has a first electrode connected to the node N, a second electrode connected to the second electrode of the driving transistor DT, and a gate electrode connected to a second gate driving signal terminal G2. The fifth transistor T5 has a second electrode connected to a first electrode of the sixth transistor T6 and a gate electrode connected to the enable signal terminal EM. The sixth transistor T6 has a second electrode connected to an initial signal terminal Vinit, and a gate electrode connected to a first reset signal terminal Re1. The third transistor T3 has a first electrode connected to the node N, a second electrode connected to the initial signal terminal Vinit, and a gate electrode connected to a second reset signal terminal Re2. The capacitor C is connected between the first power terminal VDD and the node N. The pixel driving circuit may be connected with a light emitting unit organic light-emitting diode (OLED) for driving the light emitting unit OLED to emit light, and the light emitting unit OLED is connected between the second electrode of the fifth transistor T5 and the second power terminal VSS. The second transistor T2 and the third transistor T3 may be N-type metal oxide transistors having smaller leakage current, so as to avoid electric leakage of the node N through the second transistor T2 and the third transistor T3 during a light emitting stage. Meanwhile, the driving transistor DT, the first transistor T1, the fourth transistor T4, the fifth transistor T5, and the sixth transistor T6 may be low temperature polysilicon transistors having higher carrier mobility, thereby facilitating to realize a display panel with high resolution, high reaction speed, high pixel density, and high aperture ratio.

Figure 2:
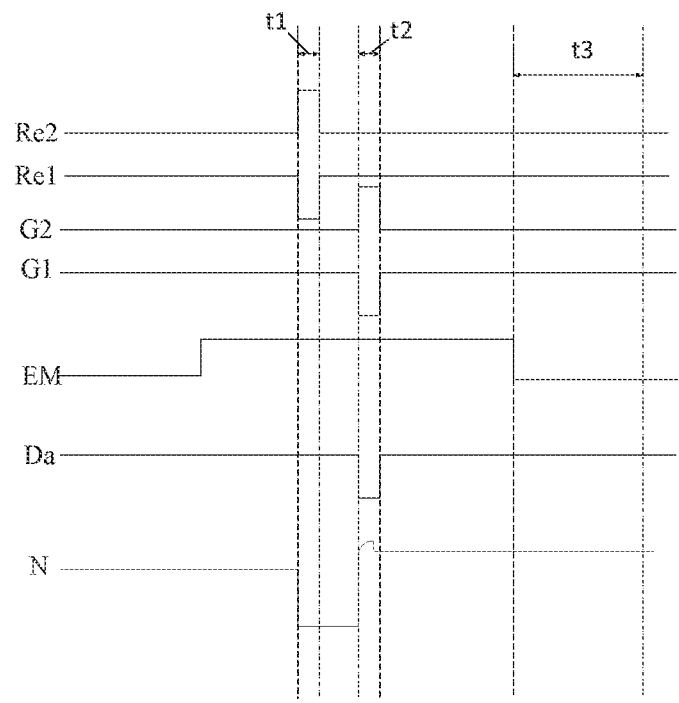
FIG. 2 is a timing diagram of nodes in a driving method of the pixel driving circuit of FIG. 1.

FIG. 2 is a timing diagram of nodes in a driving method of the pixel driving circuit of FIG. 1. In FIG. 2, "G1" represents a timing sequence of the first gate driving signal terminal G1, "G2" represents a timing sequence of the second gate driving signal terminal G2, "Re1" represents a timing sequence of the first reset signal terminal Re1, "Re2" represents a timing sequence of the second reset signal terminal Re2, "N" represents a timing sequence of the node N, "EM" represents a timing sequence of the enable signal terminal EM, and "Da" represents a timing sequence of the data signal terminal Da. The driving method of the pixel driving circuit may include a reset stage t1, a compensation stage t2, and a light emitting stage t3. In the reset stage t1, the first reset signal terminal Re1 outputs a low level signal, the second reset signal terminal Re2 outputs a high level signal, the third transistor T3 and the sixth transistor T6 are turned on, and the initial signal terminal Vinit inputs an initialization signal to the node N and the second electrode of the fifth transistor T5. In the compensation stage t2, the first gate driving signal terminal G1 outputs a low level signal, the second gate driving signal terminal G2 outputs a high level signal, the first transistor T1 and the second transistor T2 are turned on, and the data signal terminal Da outputs a driving signal to write a voltage Vdata+Vth to the node N, wherein Vdata is a voltage of the driving signal and Vth is a threshold voltage of the driving transistor DT. In the light emitting stage t3, the enable signal terminal EM outputs a low level signal, the fourth transistor T4 and the fifth transistor T5 are turned on, and the driving transistor DT emits light under the action of the voltage Vdata+Vth stored in the capacitor C. According to a driving transistor output current formula, I=(μWCox/2L)(Vgs−Vth)2, where μ is carrier mobility, Cox is a gate capacitance per unit area, W is a width of a driving transistor channel, L is a length of the driving transistor channel, Vgs is a gate-source voltage difference of the driving transistor, and Vth is a threshold voltage of the driving transistor. The output current of the driving transistor in the pixel driving circuit of the present disclosure is I=(μWCox/2L)(Vdata+Vth−Vdd−Vth)2. The pixel driving circuit can avoid the influence of a threshold of the driving transistor on its output current.

However, due to the parasitic capacitance between the gate electrode and the first electrode of the second transistor T2, as shown in FIG. 2, after the compensation stage t2 is completed, the second gate driving signal terminal G2 decreases from the high level to the low level, that is, the gate electrode of the second transistor T2 decreases from the high level to the low level, the voltage of the first electrode of the second transistor T2 decreases in case of the capacitive coupling effect, and the voltage of the node N connected with the first electrode of the second transistor T2 decreases also. According to the above driving transistor output current formula, decreasing the voltage of the node N (e.g., the gate electrode of the driving transistor) will affect the output current of the driving transistor. In order to ensure that the driving transistor outputs the driving current as normally required, the source driving circuit is required to provide a higher voltage data signal to the data signal terminal through the data line. By simulation, when the pixel driving circuit displays a gray scale of 0, the voltage provided by the source driving circuit to the data line is required to be greater than 6.3V, but the maximum voltage provided by the existing source driving circuit to the data line is 6V, which cannot meet the normal display requirements.

Figure 3:
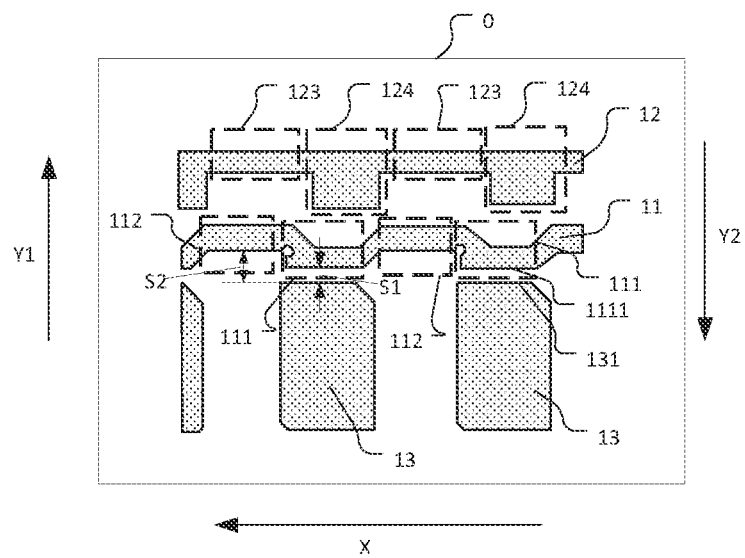
FIG. 3 is a structural layout of an array substrate of an exemplary embodiment of the present disclosure.

Based on this, this exemplary embodiment provides an array substrate, which may include a pixel driving circuit and a data line. The circuit structure of the pixel driving circuit may be as shown in FIG. 1, and the driving method may be as shown in FIG. 2. FIG. 3 shows a structural layout of an array substrate of an exemplary embodiment of the present disclosure. The array substrate may further include a base substrate 0 and a first conductive layer arranged at a side of the base substrate 0. The first conductive layer may include a first conductive portion 13, a first gate line 11 and a second gate line 12. The first conductive portion 13 may be used to form a gate electrode of the driving transistor. The first gate line 11 may be located at a side of the first conductive portion 13, and a portion of the first gate line 11 may be used to form a gate electrode of the first transistor. The second gate line 12 may be located at a side of the first gate line 11 away from the first conductive portion 13, and a portion of the second gate line 12 may be used to form a first gate electrode of the second transistor.

In the array substrate of this exemplary embodiment, the second gate line 12 is arranged at a side of the first gate line 11 away from the first conductive portion 13. On the one hand, this arrangement increases a distance between the second gate line 12 and the first conductive portion 13, reduces a lateral capacitance between the second gate line 12 and the first conductive portion 13, and thus reduces a pull-down effect of the second transistor gate electrode on the driving transistor gate electrode after the compensation stage is completed. On the other hand, the first gate line 11 and the first conductive portion 13 may form a lateral capacitance, as shown in FIG. 2, the first transistor jumps from the low level to the high level after the compensation stage t2 is completed, so that the gate electrode of the first transistor may produce a pull-up effect on the gate electrode of the driving transistor. The array substrate provided by this exemplary embodiment reduces a distance between the first gate line 11 and the first conductive portion 13, increases a lateral capacitance between the first gate line 11 and the first conductive portion 13, and thus enhances a pull-up effect of the gate electrode of the first transistor on the gate electrode of the driving transistor. Further, the first gate line 11 is located between the first conductive portion 13 and the second gate line 12, and the first gate line 11 may shield the second gate line 12 to a certain extent, thereby further reducing the pull-down effect of the second transistor gate electrode on the driving transistor gate electrode. In this exemplary embodiment, the pull-up effect of the first gate line 11 on the first conductive portion 13 is stronger than the pull-down effect of the second gate line 12 on the first conductive portion 13, so that the array substrate can offset the pull-down effect of the second transistor on the driving transistor gate electrode to a certain extent.

It should be understood that in other exemplary embodiments, the pixel driving circuit in the array substrate may also be of other circuit structures. In the pixel driving circuit formed by the LTPO technology, the N-type first transistor connected between the gate electrode and the second electrode of the driving transistor will produce a pull-down effect on the gate electrode of the driving transistor after the compensation stage is completed. Accordingly, other exemplary embodiments can reduce the pull-down effect of the gate electrode of the N-type first transistor on the gate electrode of the driving transistor and increase the pull-down effect of the gate electrode of the P-type second transistor on the gate electrode of the driving transistor through the structural design of the array substrate described above, so as to weaken the pull-down effect of the second transistor on the gate electrode of the driving transistor.

In this exemplary embodiment, as shown in FIG. 3, the first gate line 11 may be located at a side of the first conductive portion 13 in a first direction Y1 and extend along a second direction X, wherein the first direction Y1 and the second direction X intersect with each other, for example, the first direction Y1 may be perpendicular to the second direction X. The first gate line 11 may include a first extending portion 111 and a second extending portion 112. An orthographic projection of the first extending portion 111 on the base substrate aligns to an orthographic projection of at least a part of the first conductive portion 13 on the base substrate in the first direction Y1. An orthographic projection of the second extending portion 112 on the base substrate misaligns to an orthographic projection of the first conductive portion 13 on the base substrate in the first direction Y1. Each of the first direction and the second direction may be a direction parallel to a plane where the base substrate is located. "An orthographic projection of the first extending portion 111 on the base substrate aligns to an orthographic projection of at least a part of the first conductive portion 13 on the base substrate in the first direction Y1" can be understood as an area covered by infinitely moving the orthographic projection of the first extending portion 111 on the base substrate along the first direction Y1 and the third direction Y2 is completely overlapped with an area covered by infinitely moving the orthographic projection of at least the part of the first conductive portion 13 on the base substrate along the first direction Y1 and the third direction Y2, wherein the first direction Y1 is opposite to the third direction Y2. "An orthographic projection of the second extending portion 112 on the base substrate misaligns to an orthographic projection of the first conductive portion 13 on the base substrate in the first direction Y1" can be understood as an area covered by infinitely moving the orthographic projection of the second extending portion 112 on the base substrate along the first direction Y1 and the third direction Y2 does not intersect with an area covered by infinitely moving the orthographic projection of the first conductive portion 13 on the base substrate along the first direction Y1 and the third direction Y2.

In this exemplary embodiment, a distance S1 between the orthographic projection of the first extending portion 111 on the base substrate and the orthographic projection of the first conductive portion 13 on the base substrate in the first direction Y1 may be smaller than a distance S2 between the orthographic projection of the second extending portion 112 on the base substrate and the orthographic projection of the first conductive portion 13 on the base substrate in the first direction Y1. As shown in FIG. 3, the distance S1 between the orthographic projection of the first extending portion 111 on the base substrate and the orthographic projection of the first conductive portion 13 on the base substrate in the first direction Y1 may refer to a distance between an edge of the orthographic projection of the first extending portion 111 on the base substrate at a side facing to the first conductive portion 13 and an edge of the orthographic projection of the first conductive portion 13 on the base substrate at a side facing to the first extending portion 111 in the first direction Y1. The distance S2 between the orthographic projection of the second extending portion 112 on the base substrate and the orthographic projection of the first conductive portion 13 on the base substrate in the first direction Y1 may refer to a distance between an edge of the orthographic projection of the second extending portion 112 on the base substrate at a side facing to the first conductive portion 13 and an edge of the orthographic projection of the first conductive portion 13 on the base substrate at a side facing to the second extending portion 112 in the first direction Y1. This arrangement reduces the distance between the first extending portion 111 and the first conductive portion 13 in the first direction, and increases the lateral capacitance between the first extending portion 111 and the first conductive portion 13, thereby further increasing the pull-up effect of the first gate line on the gate electrode of the driving transistor.

In this exemplary embodiment, as shown in FIG. 3, the first extending portion 111 includes a third edge 1111 at a side facing to the first conductive portion 13, and the first conductive portion 13 includes a fourth edge 131 at a side facing to the first extending portion 111. A size of the orthographic projection of the third edge 1111 on the base substrate in the second direction X may be equal to a size of the orthographic projection of the fourth edge 131 on the base substrate in the second direction X. This arrangement can greatly increase the capacitance value of the lateral capacitance formed by the first extending portion 111 and the first conductive portion 13, so as to further increase the pull-up effect of the first gate line on the gate electrode of the driving transistor. Both the third edge 1111 and the fourth edge 131 may extend along the second direction. It should be understood that in other exemplary embodiments, the third edge 1111 and the fourth edge 131 may also extend in a direction intersecting with the second direction. At this time, "the size of the orthographic projection of the third edge 1111 on the base substrate in the second direction X" can be understood as a size of a right-angle side extending in the second direction in a right triangle in which the orthographic projection of the third edge 1111 on the base substrate is its hypotenuse. The size of the orthographic projection of the fourth edge 131 on the base substrate in the second direction X can be understood as a size of a right-angle side extending in the second direction in a right triangle in which the orthographic projection of the fourth edge 131 on the base substrate is its hypotenuse. In addition, the size of the orthographic projection of the third edge 1111 on the base substrate in the second direction X may also be smaller than the size of the orthographic projection of the fourth edge 131 on the base substrate in the second direction X.

In this exemplary embodiment, at least a part of the second extending portion 112 may be used to form the gate electrode of the first transistor. Since the distance between the orthographic projection of the second extending portion 112 on the base substrate and the orthographic projection of the first conductive portion 13 on the base substrate in the first direction is larger, a space for arranging the first transistor may be fully reserved in this design.

In this exemplary embodiment, as shown in FIG. 3, the array substrate may include a plurality of pixel driving circuits. The first conductive layer may include a plurality of first conductive portions 13 distributed at intervals in the second direction X, and the plurality of first conductive portions 13 are used to respectively form gate electrodes of driving transistors in different pixel driving circuits. The first gate line 11 may include a plurality of first extending portions 111 and a plurality of second extending portions 112, wherein the first extending portions 111 may be arranged in one-to-one correspondence with the first conductive portions 13, and the orthographic projection of one of the first extending portions 111 on the base substrate is opposite to the orthographic projection of at least a part of the corresponding one of the first conductive portions 13 on the base substrate in the first direction Y1.

Figure 4:
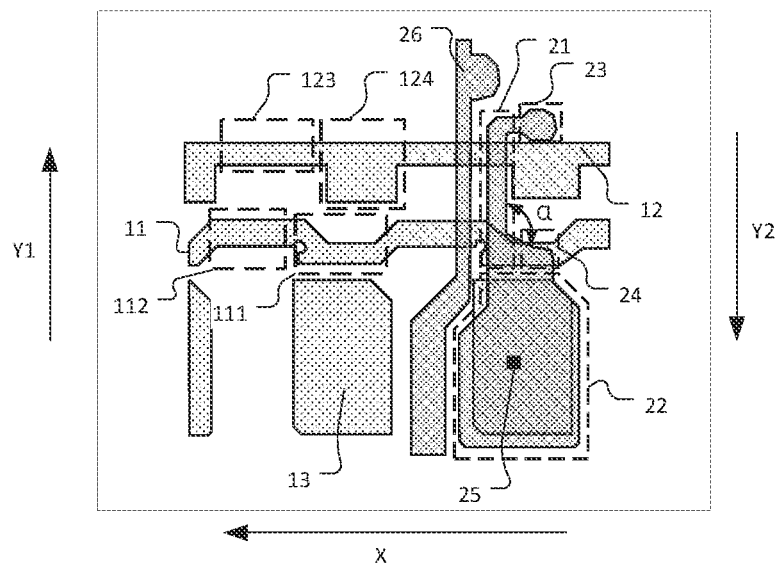
FIG. 4 is a structural layout of an array substrate of another exemplary embodiment of the present disclosure.
Figure 5:
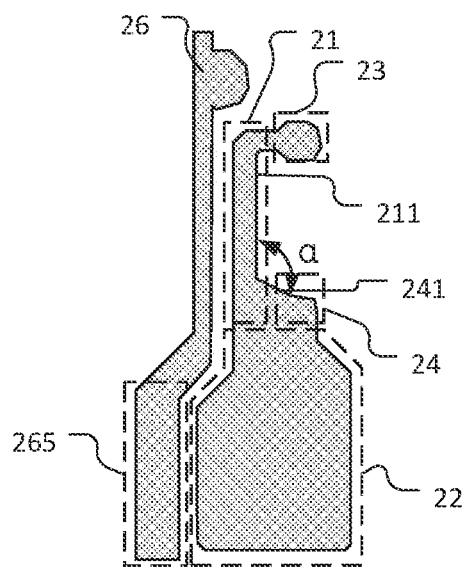
FIG. 5 is a structural layout of a second conductive layer in FIG. 4.

In this exemplary embodiment, as shown in FIGS. 4 and 5, FIG. 4 is a structural layout of an array substrate of another exemplary embodiment of the present disclosure, and FIG. 5 is a structural layout of the second conductive layer in FIG. 4. The array substrate may also include a second conductive layer, which may be arranged at a side of the first conductive layer facing away from the base substrate 0. The second conductive layer may include a second conductive portion 22, a third conductive portion 23 and a first conductive line 21. The orthographic projection of the second conductive portion 22 on the base substrate 0 is at least partially overlapped with the orthographic projection of the first conductive portion 13 on the base substrate 0, and the second conductive portion is connected with the first conductive portion 13 through a via hole 25. The third conductive portion 23 may be used to form a first electrode of the second transistor, and the orthographic projection of the first gate line 11 on the base substrate 0 is located between the orthographic projection of the second conductive portion 22 on the base substrate and the orthographic projection of the third conductive portion 23 on the base substrate. The first conductive line 21 is connected between the second conductive portion 22 and the third conductive portion 23, so that the first electrode of the second transistor is connected to the gate electrode of the driving transistor. The first conductive line 21 may extend along the first direction Y1, and the orthographic projection of the first conductive line 21 on the base substrate intersects with the orthographic projection of the first gate line 11 on the base substrate. Since the orthographic projection of the first conductive line 21 on the base substrate intersects with the orthographic projection of the first gate line 11 on the base substrate, a part of the first conductive line 21 and a part of the first gate line 11 may form a parallel plate capacitor structure. By using the coupling effect of the parallel plate capacitor structure, the first gate line 11 may pull up the first conductive line 21 after the compensation stage of the pixel driving circuit is completed, and since the first conductive line 21 is electrically connected with the first conductive portion 13, this arrangement can further enhance the pull-up effect of the first gate line 11 on the first conductive portion 13.

In this exemplary embodiment, as shown in FIGS. 4 and 5, the second conductive layer may further include a fourth conductive portion 24, which may be connected to the first conductive line 21, and an orthographic projection of the fourth conductive portion 24 on the base substrate may be at least partially overlapped with the orthographic projection of the first gate line 11 on the base substrate. The fourth conductive portion 24 may include a first edge 241, the first conductive line 21 may include a second edge 211 connected with the first edge 241 of the fourth conductive portion, and an angle α between an orthographic projection of the first edge 241 on the base substrate and an orthographic projection of the second edge 211 on the base substrate is less than 180 degrees. A part of the fourth conductive portion 24 and a part of the first gate line 11 may form a parallel plate capacitor structure. By using the coupling effect of the parallel plate capacitor structure, the first gate line 11 may pull up the fourth conductive portion 24 after the compensation stage of the pixel driving circuit is completed, and since the fourth conductive portion 24 is electrically connected with the first conductive portion 13 through the first conductive line 21, this arrangement can further enhance the pull-up effect of the first gate line 11 on the first conductive portion 13. As shown in FIGS. 4 and 5, the fourth conductive portion 24 may be connected to a side of the first conductive line 21 opposite to the second direction X, and specifically, the orthographic projection of the fourth conductive portion 24 on the base substrate may be at least partially overlapped with the orthographic projection of the first extending portion 111 on the base substrate.

As shown in TABLE 1 below, "C" in TABLE 1 represents the parasitic capacitance formed by the first gate line and the first conductive portion (e.g., node N), "Vn" represents the voltage of the node N in FIG. 1 in the light-emitting stage, and TABLE 1 shows the Vn corresponding to different parasitic capacitances C in the state where the data signal voltage is 6V. It can be seen from TABLE 1 that the larger the parasitic capacitance C is, the stronger the pull-up effect of the first gate line on the first conductive portion is.

TABLE 1

| Vn (V) | C (fF) | Vdata (V) |
| --- | --- | --- |
| 5.13 | 20 | 6 |
| 4.65 | 15 | |
| 4.12 | 10 | |
| 3.56 | 5 | |
| 2.99 | 0 | |

In this exemplary embodiment, as shown in FIGS. 3, 4 and 5, the orthographic projection of the second gate line 12 on the base substrate may be located between the orthographic projection of the first gate line 11 on the base substrate and the orthographic projection of the third conductive portion 23 on the base substrate. The second gate line 12 may include a third extending portion 123 and a fourth extending portion 124 which are alternately connected in sequence along the second direction X, wherein a size of the orthographic projection of the third extending portion 123 on the base substrate in the first direction Y1 may be smaller than a size of the orthographic projection of the fourth extending portion 124 on the base substrate in the first direction Y1. The orthographic projection of the first conductive line 21 on the base substrate may intersect with the orthographic projection of the third extending portion 123 on the base substrate. A part of the third extending portion 123 and a part of the first conductive line 21 may form a parallel plate capacitor structure. Based on the coupling effect of the parallel plate capacitor structure, the third extending portion 123 may pull down the first conductive line 21 after the compensation stage of the pixel driving circuit is completed, and since the first conductive line 21 is electrically connected with the first conductive portion 13, the third extending portion 123 can pull down the first conductive portion 13. In this exemplary embodiment, the size of the orthographic projection of the third extending portion 123 on the base substrate in the first direction Y1 is smaller than the size of the orthographic projection of the fourth extending portion 124 on the base substrate in the first direction Y1, that is, this exemplary embodiment reduces the size of the third extending portion 123 in the first direction Y1, thus reducing an electrode area of the parallel plate capacitor structure formed by the third extending portion 123 and the first conductive line 21. According to the capacitance calculation formula of the parallel plate capacitor, the capacitance of the parallel plate capacitor structure is proportional to its electrode area, and this arrangement reduces the capacitance of the parallel plate capacitor structure formed by the third extending portion 123 and the first conductive line 21, thus reducing the pull-down effect of the third extending portion 123 on the first conductive portion 13. A part of the fourth extending portion 124 may be used to form the first gate electrode of the second transistor. A channel region of the second transistor may extend along the first direction Y1, so that the channel region of the second transistor may have a larger length to reduce the leakage current of the second transistor.

In this exemplary embodiment, as shown in FIGS. 4 and 5, the second conductive layer may further include a power line 26, which may extend along the first direction Y1 and may be used to provide a first power terminal as shown in FIG. 1. An orthographic projection of the power line 26 on the base substrate may intersect with the orthographic projection of the third extending portion 123 on the base substrate. This arrangement can reduce the overlapping area between the power line 26 and the second gate line, thereby reducing the capacitive coupling effect of the power line 26 on the second gate line 12 when the voltage fluctuates.

Figure 6:
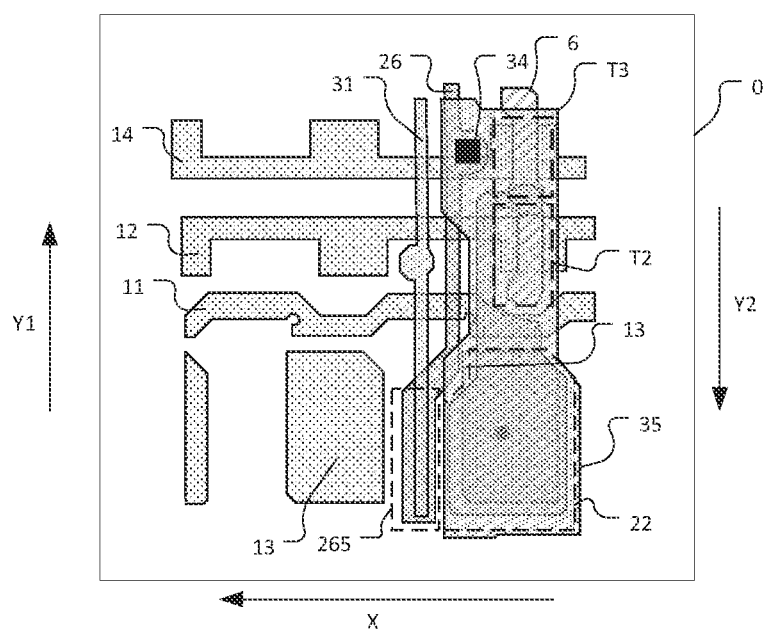
FIG. 6 is a structural layout of an array substrate of another exemplary embodiment of the present disclosure.
Figure 7:
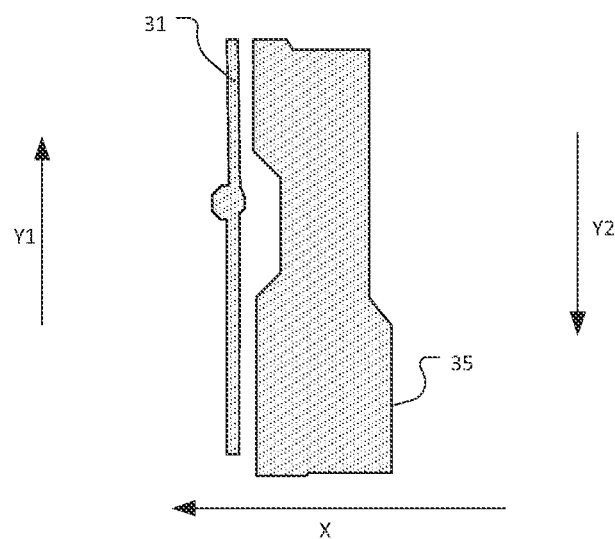
FIG. 7 is a structural schematic diagram of a third conductive layer in FIG. 6.

As shown in FIGS. 6 and 7, FIG. 6 is a structural layout of an array substrate of another exemplary embodiment of the present disclosure, and FIG. 7 is a structural schematic diagram of the third conductive layer in FIG. 6. The array substrate may further include a third conductive layer, and the third conductive layer may be arranged at a side of the second conductive layer facing away from the base substrate. As shown in FIGS. 5 and 6, the power line 26 may include a fifth extending portion 265, and an orthographic projection of the fifth extending portion 265 on the base substrate is opposite to the orthographic projection of at least a part of the first conductive portion 13 on the base substrate in the second direction X. "The orthographic projection of the fifth extending portion 265 on the base substrate is opposite to the orthographic projection of at least a part of the first conductive portion 13 on the base substrate in the second direction X" can be understood as that, an area covered by the orthographic projection of the fifth extending portion 265 on the base substrate moving infinitely in the second direction and in a direction opposite to the second direction completely is fully overlapped with an area covered by the orthographic projection of at least a part of the first conductive portion 13 moving infinitely in the second direction and in the direction opposite to the second direction. The third conductive layer may include the data line 31, which extends along the first direction Y1, and the orthographic projection of a part of the data line 31 on the base substrate may be located on the orthographic projection of the fifth extending portion 265 on the base substrate. The fifth extending portion 265 is arranged between the data line 31 and the first conductive portion 13, and receives a stable voltage, so that the fifth extending portion 265 may serve as a shielding layer to reduce the coupling capacitance between the data line 31 and the first conductive portion 13, thereby reducing the coupling effect of the data line 31 on the first conductive portion 13.

In this exemplary embodiment, as shown in FIGS. 6 and 7, the third conductive layer may further include a fifth conductive portion 35, and the fifth conductive portion 35 may be connected to the power line 26 through a via hole 34. An orthographic projection of the fifth conductive portion 35 on the base substrate 0 may cover an orthographic projection of the first conductive portion 13 on the base substrate 0, and an orthographic projection of the fifth conductive portion 35 on the base substrate 0 may cover an orthographic projection of the second conductive portion 22 on the base substrate 0. The fifth conductive portion 35 covers the first conductive portion 13 and the second conductive portion 22, and receives a stable voltage, so that the fifth conductive portion 35 can serve as a shielding layer to reduce the capacitive coupling effect of other signals on the first conductive portion 13 and the second conductive portion 22. For example, the fifth conductive portion 35 may reduce the capacitive coupling effect of the data line and the anode layer on the first conductive portion 13 and the second conductive portion 22.

In this exemplary embodiment, as shown in FIG. 6, the first conductive layer may further include a third gate line 14 located at a side of the second gate line 12 away from the first conductive portion 13 and extending along the second direction X, wherein a part of the third gate line 14 may be used to form a gate electrode of the third transistor T3. As shown in FIG. 6, the array substrate may further include a second active layer arranged between the first conductive layer and the second conductive layer. The second active layer may include a fourth active portion 6, and the fourth active portion 6 may extend along the first direction Y1. An orthographic projection of the fourth active portion 6 on the base substrate 0 intersects with an orthographic projection of the fourth extending portion 124 on the base substrate 0 to form the second transistor T2 in FIG. 1. The orthographic projection of the fourth active portion 6 on the base substrate 0 intersects with an orthographic projection of the third gate line 14 on the base substrate 0 to form the third transistor T3 in FIG. 1. The orthographic projection of the fifth conductive portion 35 on the base substrate 0 may also cover the orthographic projection of the second transistor T2 and the orthographic projection of the third transistor T3 on the base substrate 0. A material of the fourth active portion 6 may be metal oxide, such as indium gallium zinc oxide. Accordingly, the second transistor and the third transistor may be metal oxide transistors whose characteristics change under light environments. The fifth conductive portion 35 covers the second transistor T2 and the third transistor T3, thereby avoiding the influence of light on the output characteristics of the second transistor T2 and the third transistor T3.

The following exemplary embodiments describe the overall structure of the array substrate in detail.

Figure 8:
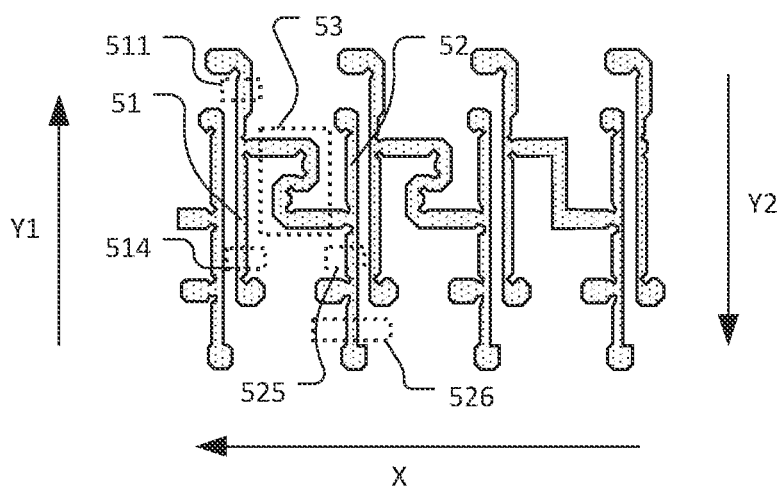
FIG. 8 is a structural layout of a first active layer.
Figure 9:
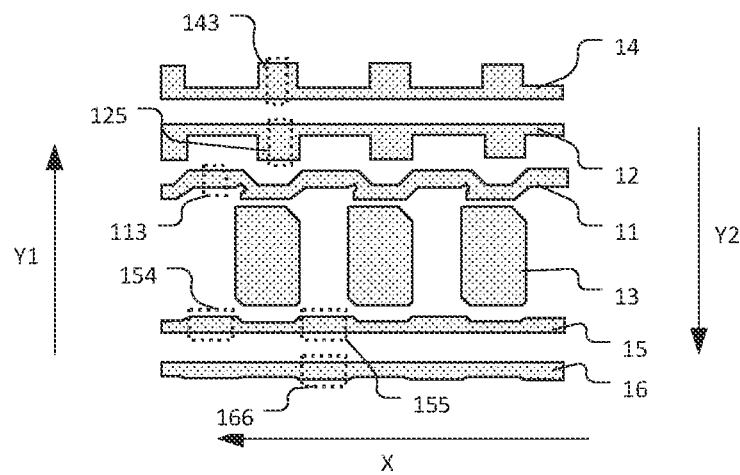
FIG. 9 is a structural layout of a first conductive layer.
Figure 10:
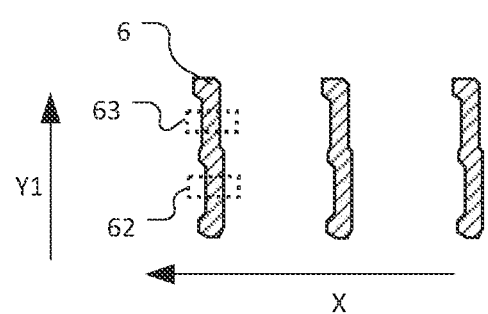
FIG. 10 is a structural layout of a second active layer.
Figure 11:
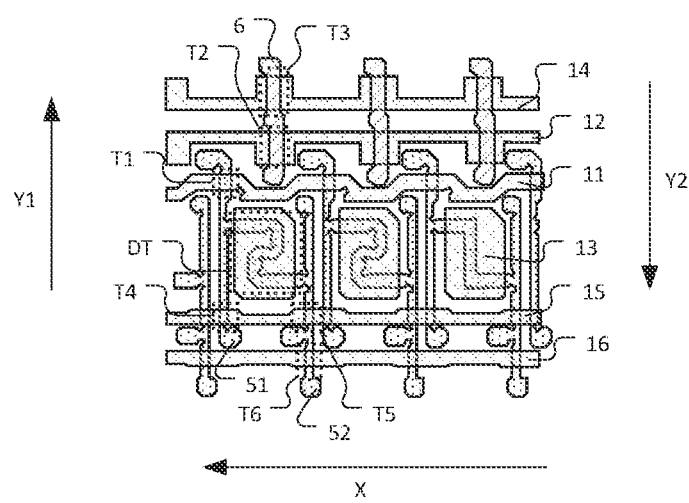
FIG. 11 is a combined layout of a first active layer, a first conductive layer and a second active layer.
Figure 12:
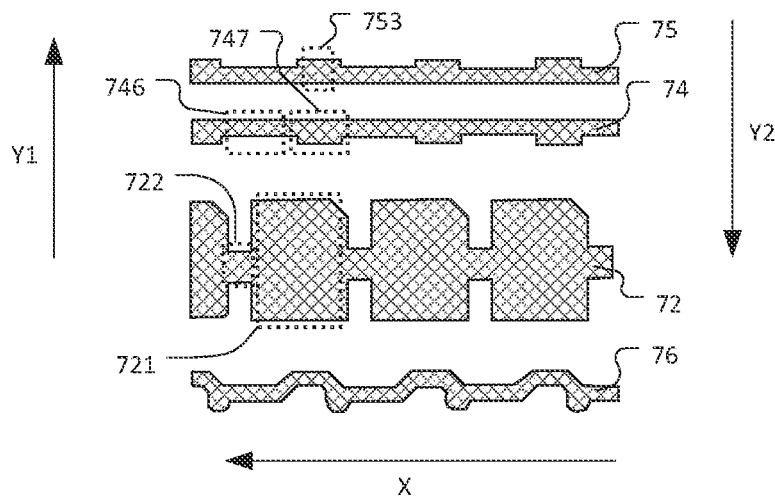
FIG. 12 is a structural layout of a fourth conductive layer.
Figure 13:
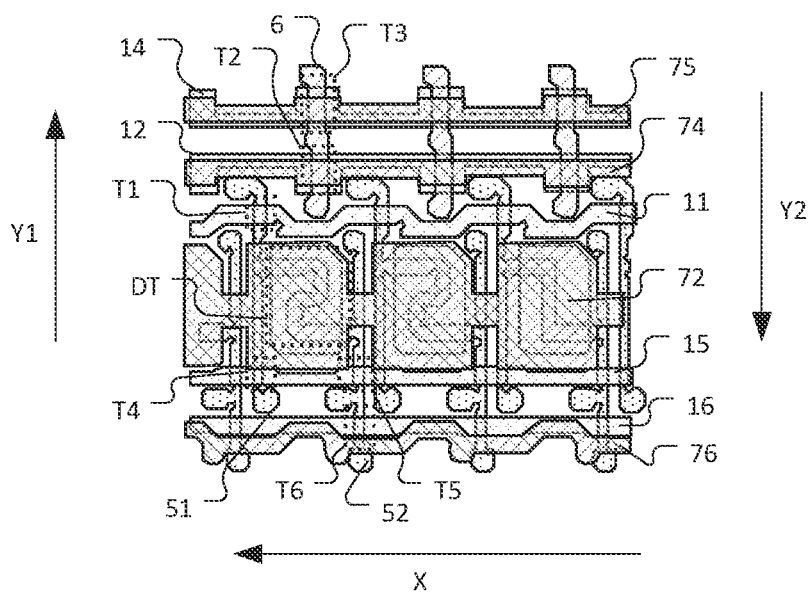
FIG. 13 is a combined layout of a first active layer, a first conductive layer, a second active layer and a fourth conductive layer.
Figure 14:
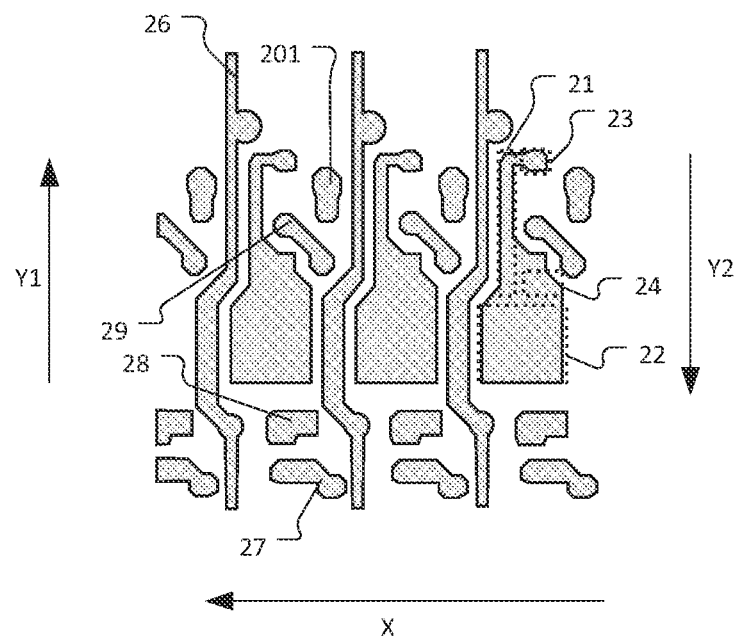
FIG. 14 is a structural layout of a second conductive layer.
Figure 15:
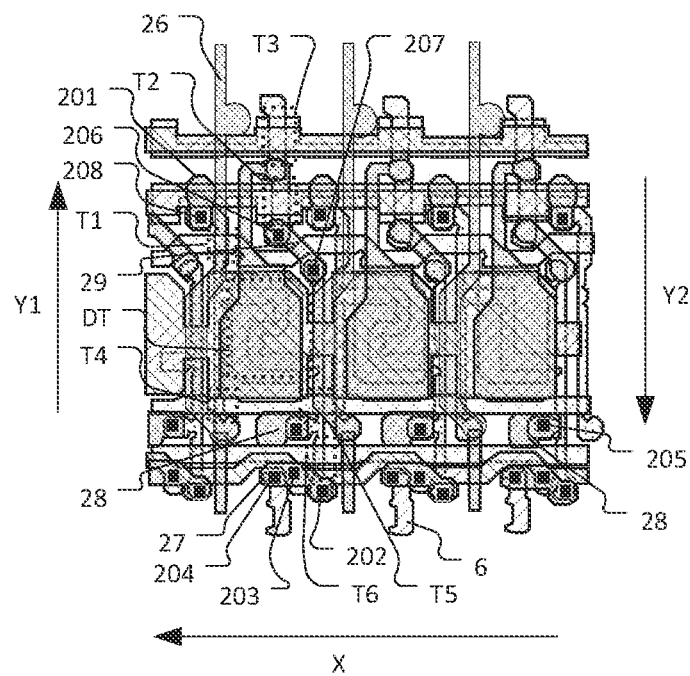
FIG. 15 is a combined layout of a first active layer, a first conductive layer, a second active layer, a fourth conductive layer and a second conductive layer.
Figure 16:
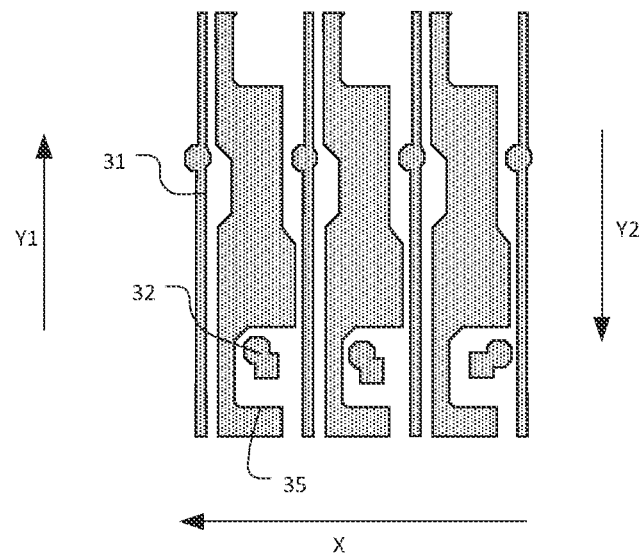
FIG. 16 is a structural layout of a third conductive layer.
Figure 17:
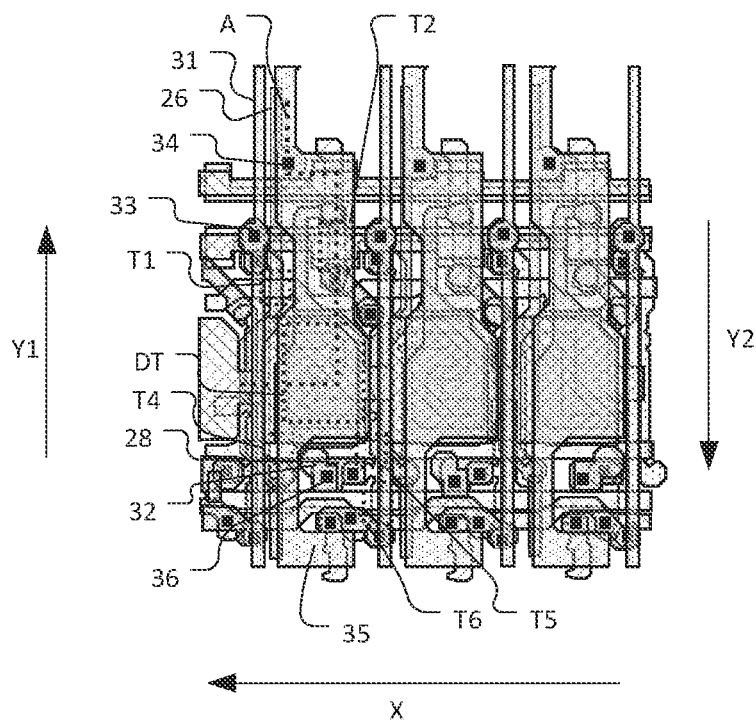
FIG. 17 is a combined layout of a first active layer, a first conductive layer, a second active layer, a fourth conductive layer, a second conductive layer and a third conductive layer.
Figure 18:
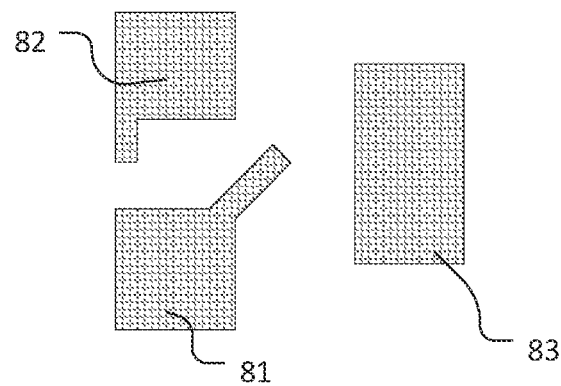
FIG. 18 is a structural layout of an anode layer.
Figure 19:
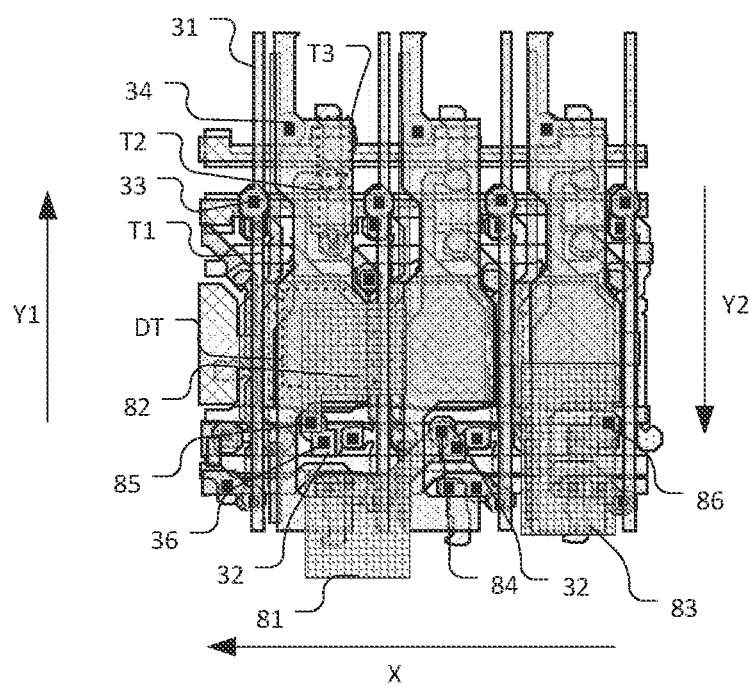
FIG. 19 is a combined layout of a first active layer, a first conductive layer, a second active layer, a fourth conductive layer, a second conductive layer, a third conductive layer and an anode layer.

As shown in FIGS. 8-19, FIG. 8 is the structural layout of the first active layer; FIG. 9 is a structural layout of a first conductive layer; FIG. 10 is a structural layout of a second active layer; FIG. 11 is a combined layout of a first active layer, a first conductive layer and a second active layer; FIG. 12 is a structural layout of a fourth conductive layer; FIG. 13 is a combined layout of a first active layer, a first conductive layer, a second active layer and a fourth conductive layer; FIG. 14 is a structural layout of a second conductive layer; FIG. 15 is a combined layout of a first active layer, a first conductive layer, a second active layer, a fourth conductive layer and a second conductive layer; FIG. 16 is a structural layout of a third conductive layer; FIG. 17 is a combined layout of a first active layer, a first conductive layer, a second active layer, a fourth conductive layer, a second conductive layer and a third conductive layer; FIG. 18 is a structural layout of an anode layer; FIG. 19 is a combined layout of a first active layer, a first conductive layer, a second active layer, a fourth conductive layer, a second conductive layer, a third conductive layer and an anode layer.

As shown in FIG. 11 and FIG. 8, the first active layer may include a first active portion 51 and a second active portion 52 extending along the first direction Y1, and the first active portion 51 and the second active portion 52 are distributed at intervals along the second direction X. A third active portion 53 is connected between the first active portion 51 and the second active portion 52. The first active portion 51 may include a first active sub-portion 511 and a second active sub-portion 514, and the second active portion 52 may include a third active sub-portion 525 and a fourth active sub-portion 526. The third active portion 53 may be configured to form a channel region of the driving transistor. The first active sub-portion 511 may be configured to form a channel region of the first transistor. The second active sub-portion 514 may be configured to form a channel region of the fourth transistor. The third active sub-portion 525 may be configured to form a channel region of the fifth transistor. The fourth active sub-portion 526 may be configured to form a channel region of the sixth transistor. In this exemplary embodiment, the first active layer may be made of polysilicon, and correspondingly, the driving transistor, the fourth transistor, the fifth transistor and the sixth transistor may be P-type low-temperature polysilicon transistors.

As shown in FIG. 11 and FIG. 9, the first conductive layer includes the first conductive portion 13, the first gate line 11, the second gate line 12, and the third gate line 14, and may also include a fifth gate line 15 and a sixth gate line 16. The fifth gate line 15 is located at a side of the first conductive portion 1 away from the first gate line, and the sixth gate line 16 is located at a side of the fifth gate line 15 away from the first conductive portion 13. Each of the first gate line 11, the second gate line 12, the third gate line 14, the fifth gate line 15 and the sixth gate line 16 may extend along the second direction X. The first gate line 11 may be configured to provide the first gate driving signal terminal in FIG. 1, and may include a first gate portion 113. The second gate line 12 may be configured to provide the second gate driving signal terminal in FIG. 1, and the second gate line 12 may include a second gate portion 125. The third gate line 14 may be configured as a second reset signal line for providing the second reset signal terminal in FIG. 1, and may include a third gate portion 143. The fifth gate line 15 may be configured as an enable signal line for providing the enable signal terminal in FIG. 1, and may include a fourth gate portion 154 and a fifth gate portion 155. The sixth gate line 16 may be configured as a first reset signal line for providing the first reset signal terminal in FIG. 1, and may include a sixth gate portion 166. The first gate portion 113 may be configured to form a gate electrode of the first transistor T1, the second gate portion 125 may be configured to form a first gate electrode of the second transistor, the third gate portion 143 may be used to form a first gate electrode of the third transistor, the fourth gate portion 154 may be used to form a gate electrode of the fourth transistor, the fifth gate portion 155 may be used to form a gate electrode of the fifth transistor, and the sixth gate portion 166 may be used to form a gate electrode of the sixth transistor. The first gate portion 113 may be located on the second extending portion 112, and the second gate portion 125 may be located on the fourth extending portion 124.

As shown in FIG. 11 and FIG. 10, the second active layer may include a plurality of fourth active portions 6 extending along the first direction Y1. The plurality of fourth active portions 6 may be distributed at intervals along the second direction X, and be arranged corresponding to a plurality of pixel driving circuits one by one. As shown in FIG. 10, the fourth active portion 6 may include a fifth active sub-portion 62 which may form a channel region of the second transistor, and a sixth active sub-portion 63 which may form a channel region of the third transistor. The second gate line 12 may shade the fifth active sub-portion 62 to prevent the output characteristics of the second transistor from being affected by light. The third gate line 14 may shade the sixth active sub-portion 63 to prevent the output characteristics of the third transistor from being affected by light.

As shown in FIGS. 12 and 13, the fourth conductive layer may include a fourth gate line 74, a fifth gate line 75, a sixth gate line 76 and a sixth conductive portion 72. Each of the fourth gate line 74, the fifth gate line 75, and the sixth gate line 76 may extend along the second direction X. The fourth gate line 74 may be connected with the second gate line 12 through a via hole in a wiring area around a display area. The fifth gate line 75 may be connected with the third gate line 14 through a via hole in the wiring area around the display area. An orthographic projection of the first gate line 11 on the base substrate is located between an orthographic projection of the first conductive portion 13 on the base substrate and an orthographic projection of the fourth gate line 74 on the base substrate. The fourth gate line 74 includes a sixth extending portion 746 and a seventh extending portion 747 which are alternately connected in sequence along the second direction X. A size of an orthographic projection of the sixth extending portion 746 on the base substrate in the first direction Y1 is smaller than a size of an orthographic projection of the seventh extending portion 747 on the base substrate in the first direction Y1. A part of the seventh extending portion 747 may form a second gate electrode of the second transistor. The fifth gate line 75 may include a seventh gate portion 753, which may form a second gate electrode of the third transistor. The fourth gate line 74 and the second gate line 12 connected in parallel can improve a transmission speed of the gate driving signal transmitted thereon, thereby improving a response speed of the second transistor. The fifth gate line 75 and the third gate line 14 connected in parallel can improve a transmission speed of the gate driving signal transmitted thereon, thereby improving a response speed of the third transistor. The sixth gate line 76 may be configured as an initial signal line for providing the initial signal terminal in FIG. 1. The sixth conductive portion 72 may include a plurality of first conductive sub-portions 721 and a plurality of second conductive sub-portions 722, which are alternately sequentially distributed along the second direction X. The second conductive sub-portion 722 are connected between adjacent first conductive sub-portions 721. An orthographic projection of the first conductive sub-portions 721 on the base substrate may cover the orthographic projection of the first conductive portion 13 on the base substrate. The second conductive sub-portions 722 may be connected with the power line in the second conductive layer through via holes, so that the first conductive sub-portion 721 may serve as a shielding layer to reduce the capacitive coupling effect of other signals (for example, signals of the data line and the anode) on the first conductive portion 13.

As shown in FIGS. 14 and 15, the second conductive layer includes the power line 26, the first conductive line 21, the third conductive portion 23, the fourth conductive portion 24, and the second conductive portion 22. The second conductive layer may further include a first connecting portion 27, a second connecting portion 28, a third connecting portion 29 and a fourth connecting portion 201. The first connecting portion 27 may be connected with the second active portion 52 through a via hole 202 to connect a second electrode of the sixth transistor. The first connecting portion 27 may also connected with the sixth gate line 76 through a via hole 203, thereby providing an initial signal terminal to the second electrode of the sixth transistor through the sixth gate line 76. In addition, the first connecting portion 27 may also be connected with the fourth active portion 6 of the next row of pixel driving circuit through a via hole 204, thereby providing an initial signal terminal to the third transistor of the next row of the pixel driving circuit through the sixth gate line 76. The second connecting portion 28 may be connected with the second active portion 52 through a via hole 205 to connect a second electrode of the fifth transistor. The third connecting portion 29 is connected with the fourth active portion 6 through a via hole 206 to connect a second electrode of the second transistor, and may be connected to the second active portion 52 through a via hole 207 to connect a second electrode of the driving transistor, so that the second electrode of the second transistor is connected with the second electrode of the driving transistor. The fourth connecting portion 201 may be connected with the first active portion 51 through a via hole 208 to connect a first electrode of the first transistor. The orthographic projection of the first conductive line 21 on the base substrate may intersect with the orthographic projection of the sixth extending portion 746 on the base substrate, thereby reducing the capacitance of the parallel plate capacitor structure formed by the sixth extending portion 746 and the first conductive line 21, and further reducing the pull-down effect of the sixth extending portion 746 on the first conductive portion 13 after the compensation stage t2 ends. In FIG. 4, the second conductive portion 22 is connected with the first conductive portion 13 through a via hole 25, wherein the via hole 25 may penetrate through the first conductive sub-portion 721 in FIG. 13, and a conductive material within the via hole 25 is insulated from the first conductive sub-portion 721. The structure may be formed by: forming a fourth dielectric layer at a side of the fourth conductive layer facing away from the base substrate; forming on the fourth dielectric layer a first via hole extending through the fourth conductive layer to the first conductive portion 13; forming a fifth dielectric layer on the fourth dielectric layer; forming the via hole 25 on the fifth dielectric layer, wherein an orthographic projection of the via hole 25 on the base substrate is within an orthographic projection of the first via hole on the base substrate; and then forming a second conductive portion on the fifth dielectric layer and filling the via hole 25.

As shown in FIGS. 16 and 17, the third conductive layer may include the data line 31 and the fifth conductive portion 35, and may also include a fifth connecting portion 32. The data line 31 may be connected with the fourth connecting portion 201 through a via hole 33 to connect a first electrode of the first transistor. The fifth conductive portion 35 may be connected with the power line 26 through a via hole 34. The fifth connecting portion 32 may be connected with the second connecting portion 28 through a via hole 36 to connect a second electrode of the fifth transistor. A distance between the first conductive portion 13 and the first conductive sub-portion 721 may be larger than a distance between the second conductive portion 22 and the fifth conductive portion 35, and two electrodes of the capacitor C in FIG. 1 may be mainly formed by the second conductive portion 22 and the fifth conductive portion 35.

As shown in FIGS. 18 and 19, the anode layer may include a first anode portion 81, a second anode portion 82 and a third anode portion 83. The first anode portion 81 may be connected with the fifth connecting portion 32 through a via hole 84 to connect a second electrode of the fifth transistor. The second anode portion 82 may be connected with the fifth connecting portion 32 in another pixel driving circuit through a via hole 85. The third anode portion 83 may be connected with the fifth connecting portion 32 in another pixel driving circuit through a via hole 86. A G light-emitting unit may be formed on the first anode portion 81; a R light-emitting unit may be formed on the second anode portion 82; and a B light-emitting unit may be formed on the third anode portion 83.

Figure 20:
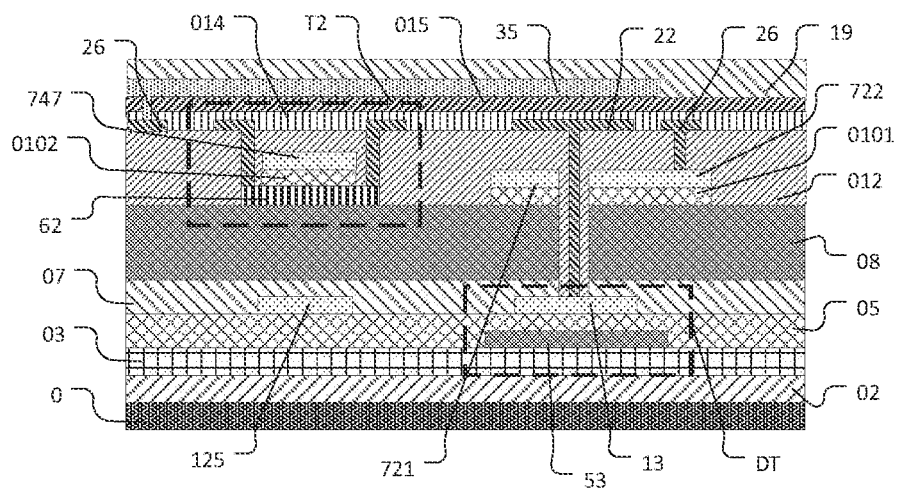
FIG. 20 is a partial sectional view taken along a broken line A in FIG. 17.

As shown in FIG. 20, it is a partial sectional view along a broken line A in FIG. 17. The array substrate may include a base substrate 0, a barrier layer 02 at a side of the base substrate 0, a second buffer layer 03 at a side of the barrier layer facing away from the base substrate 0, a first active layer (including a third active portion 53) at a side of the second buffer layer 03 facing away from the base substrate 0, a second gate insulating layer 05 at a side of the first active layer facing away from the base substrate, a first conductive layer (including a first conductive portion 13 and a second gate portion 125) at a side of the second gate insulating layer facing away from the base substrate, a first dielectric layer 07 at a side of first conductive layer facing away from the base substrate, a first buffer layer 08 at a side of the first dielectric layer 07 facing away from the base substrate 0, a second active layer (including a fifth active sub-portion 62) at a side of the first buffer layer 08 facing away from the base substrate 0, a first gate insulating layer (including a first insulating portion 0101 and a second insulating portion 0102) at a side of the second active layer facing away from the base substrate, a fourth conductive layer (including a first conductive sub-portion 721, a seventh extending portion 747 and a second conductive sub-portion 722) at a side of the first gate insulating layer facing away from the base substrate, a second dielectric layer 012 at a side of the fourth conductive layer facing away from the base substrate, a second conductive layer (including a second conductive portion 22 and a power line 26) at a side of the second dielectric layer 012 facing away from the base substrate, a passivation layer 014 at a side of the second conductive layer facing away from the base substrate, a first flat layer 015 at a side of the passivation layer 014 facing away from the base substrate, a third conductive layer (including a fifth conductive portion 35) at a side of first flat layer 015 facing away from the base substrate, and a second flat layer 19 at a side of the third conductive layer facing away from the base substrate. The third active portion 53 is configured to form a channel region of the driving transistor DT, and the fifth active sub-portion 62 is configured to form a channel region of the second transistor T2.

In this exemplary embodiment, the base substrate may include a first polyimide (PI) layer, a first silicon oxide (SiO) layer, an amorphous silicon layer, a second polyimide (PI) layer, and a second silicon oxide layer which are sequentially arranged. The barrier layer 02 may be located at a side of the second silicon oxide layer facing away from the first polyimide (PI) layer. A thicknesses of each of the first polyimide (PI) layer and the second polyimide (PI) layer may be 90,000-110,000±5% angstroms (Å), such as 90,000 angstroms, 95,000 angstroms and 110,000 angstroms. A thickness of the first silicon oxide layer may be 5,000-7,000 angstroms, such as 5,000 angstroms, 5,500 angstroms and 7,000 angstroms. A thickness of the amorphous silicon layer may be 40-60 angstroms, such as 40 angstroms, 45 angstroms and 60 angstroms. A thickness of the second silicon oxide layer may be 4,500-6,500 angstroms, such as 4,500 angstroms, 5,000 angstroms and 6,500 angstroms.

In this exemplary embodiment, the second buffer layer 03 may include a first silicon nitride (SiN) layer and a third silicon oxide layer sequentially arranged, and the first silicon nitride layer may be located between the third silicon oxide layer and the base substrate. A thickness of the first silicon nitride layer may be 900-1,100 angstroms, such as 900 angstroms, 950 angstroms and 1,100 angstroms. A thickness of the third silicon oxide layer may be 2,000-4,000 angstroms, such as 2,000 angstroms, 2,500 angstroms and 4,000 angstroms. The first active layer may be a polysilicon layer, and a thickness of the first active layer may be 400-600 angstroms, such as 400 angstroms, 500 angstroms and 600 angstroms. The second gate insulating layer 05 may be a silicon oxide layer, and a thickness of the second gate insulating layer 05 may be 500-2,000 angstroms, such as 500 angstroms, 1,500 angstroms and 2,000 angstroms. The first conductive layer and the fourth conductive layer may be molybdenum layers, and a thicknesses of each of the first conductive layer and the fourth conductive layer may be 1,500-2,500 angstroms, such as 1,500 angstroms, 2,000 angstroms and 2,500 angstroms. The first dielectric layer 07 may be a silicon nitride layer, and a thickness of the first dielectric layer 07 may be 1,200-1,400 angstroms, such as 1,200 angstroms, 1,300 angstroms and 1,400 angstroms. The first buffer layer 08 may be a silicon oxide layer, and a thickness of the first buffer layer 08 may be 3,000-5,000 angstroms, such as 3,000 angstroms, 3,500 angstroms and 5,000 angstroms. The second active layer may be an indium gallium zinc oxide (IGZO) layer, and a thickness of the second active layer may be 300-500 angstroms, such as 300 angstroms, 350 angstroms and 500 angstroms. The second gate insulating layer 05 may be a silicon oxide layer, and a thickness of the second gate insulating layer 05 may be 1,000-2,000 angstroms, such as 1,000 angstroms, 1,500 angstroms and 2,000 angstroms. The second conductive layer may include a first titanium layer, an aluminum layer, and a second titanium layer which are sequentially stacked. Each of the thicknesses of the first titanium layer and the second titanium layer may be 300-700 angstroms, such as 300 angstroms, 450 angstroms, and 700 angstroms, and a thickness of the aluminum layer may be 4,500-6,500 angstroms, such as 4,500 angstroms, 5,000 angstroms, and 6,500 angstroms. The second flat layer 19 may be a polyimide (PI) layer, and a thickness of the second flat layer 19 may be 10,000-20,000 angstroms, such as 10,000 angstroms, 16,000 angstroms and 20,000 angstroms.

In this exemplary embodiment, an anode layer may be further provided at a side of the second flat layer 19 facing away from the base substrate, a pixel definition layer may be further provided at a side of the anode layer facing away from the base substrate, and a supporting column is provided at a side of the pixel definition layer facing away from the base substrate. The pixel definition layer may be a polyimide (PI) layer, and a thickness of the pixel definition layer may be 10,000-20,000 angstroms, such as 10,000 angstroms, 16,000 angstroms and 20,000 angstroms. The support column may be a polyimide (PI) layer, and a thickness of the support column may be 10,000-20,000 angstroms, such as 10,000 angstroms, 16,000 angstroms and 20,000 angstroms. The anode layer may include a first indium tin oxide layer, a silver layer and a second indium tin oxide layer which are sequentially arranged. A thickness of each of the first indium tin oxide layer and the second indium tin oxide layer may be 50-100 angstroms, such as 50 angstroms, 80 angstroms and 100 angstroms, and a thickness of the silver layer may be 500-1,500 angstroms, such as 500 angstroms, 800 angstroms and 1,500 angstroms.

It should be understood that the structural film layer may also be made of other materials and in other thicknesses. For example, the dielectric layer and the passivation layer may also be made of silicon nitride or transparent organic resin etc., and the flat layer may also be made of transparent polyimide (CPI), polyethylene terephthalate (PET), polyethylene naphthalate (PEN) or other materials. The conductive layer may also be made of metal materials, such as copper or molybdenum, etc.

In this exemplary embodiment, since the second conductive portion 22 is required to form an electrode of a capacitor, the second conductive portion 22 is required to be designed to have a larger area, so that the fifth conductive portion 35 is not apt to completely cover the second conductive portion 22 within a limited plane space, and thus the second conductive portion 22 is easily disturbed by external noise. In addition, the second conductive portion 22 with a larger area is apt to form larger parasitic capacitances with other structures, and under the coupling effect of the parasitic capacitance, the gate electrode of the driving transistor is more susceptible to external noise interference.

Figure 21:
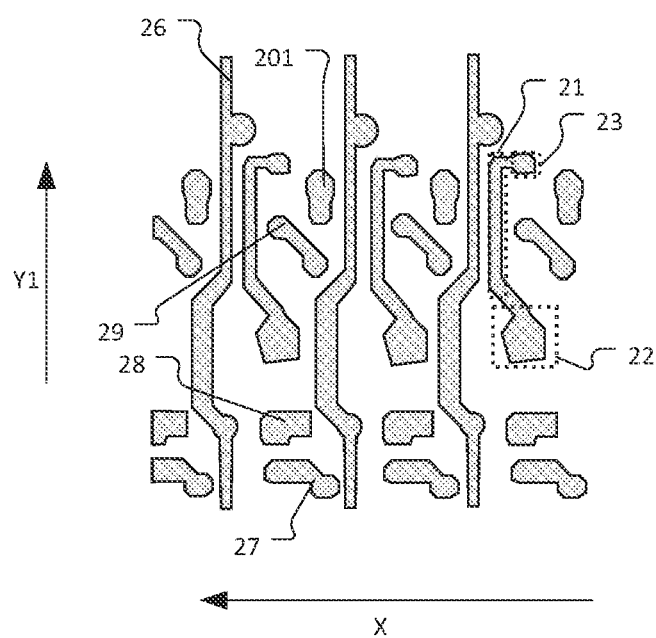
FIG. 21 is a structural layout of a second conductive layer of an array substrate in another exemplary embodiment of the present disclosure.
Figure 22:
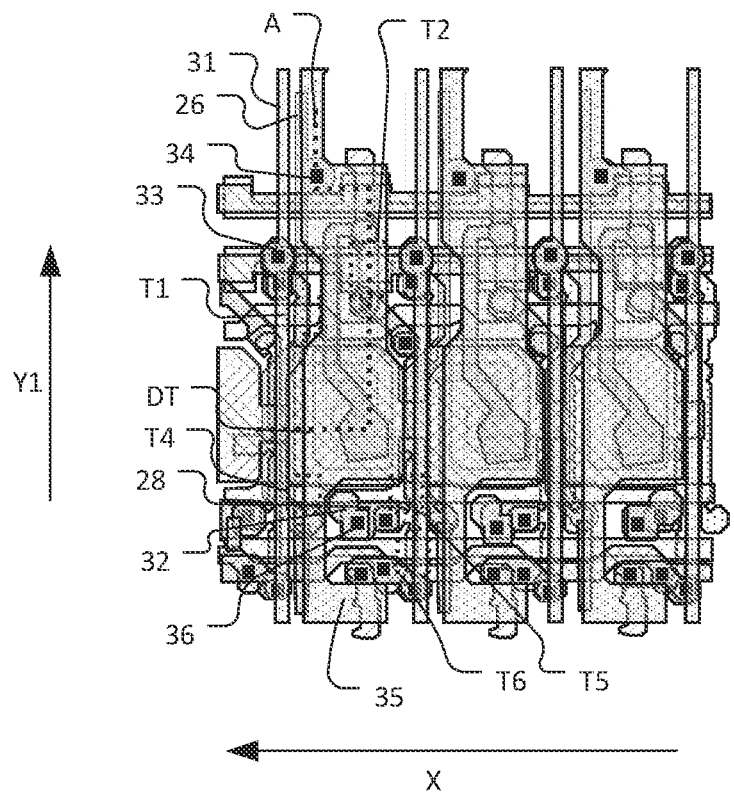
FIG. 22 is a combined layout of a first active layer, a first conductive layer, a second active layer, a fourth conductive layer, a second conductive layer and a third conductive layer of an array substrate in another exemplary embodiment of the present disclosure.
Figure 23:
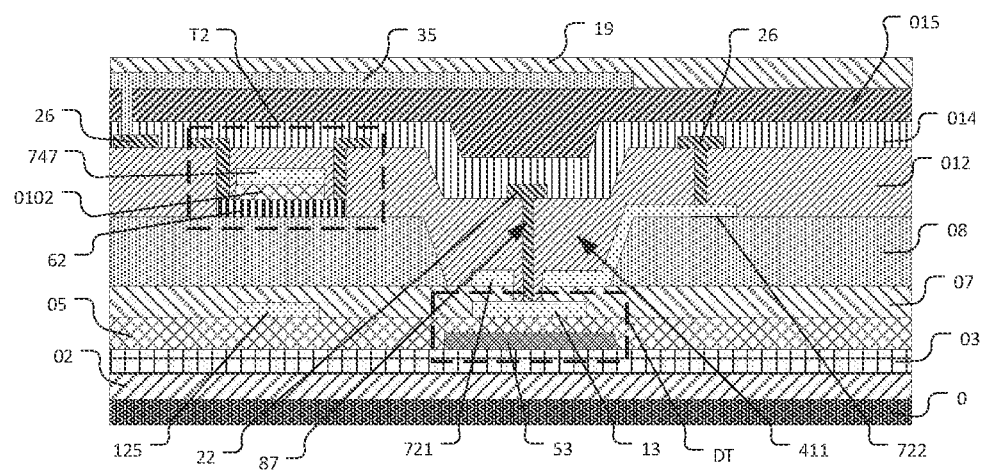
FIG. 23 is a sectional view taken along the broken line A in FIG. 22.

As shown in FIGS. 21 and 22, FIG. 21 is a structural layout of a second conductive layer of an array substrate in another exemplary embodiment of the present disclosure, and FIG. 22 is a combined layout of a first active layer, a first conductive layer, a second active layer, a fourth conductive layer, a second conductive layer and a third conductive layer of an array substrate in another exemplary embodiment of the present disclosure. The combined layout shown in FIG. 22 differs from the combined layout shown in FIG. 17 only in the structure of the second conductive layer. As shown in FIG. 23, it is a partial sectional view along the broken line A in FIG. 22. The array substrate may include a base substrate 0, a barrier layer 02 at a side of the base substrate 0, a second buffer layer 03 at a side of the barrier layer facing away from the base substrate 0, a first active layer (including a third active portion 53) at a side of the second buffer layer 03 facing away from the base substrate 0, a second gate insulating layer 05 at a side of the first active layer facing away from the base substrate, a first conductive layer (including a first conductive portion 13 and a second gate portion 125) at a side of the second gate insulating layer facing away from the base substrate, a first dielectric layer 07 at a side of the first conductive layer facing away from the base substrate, a first buffer layer 08 at a side of the first dielectric layer 07 facing away from the base substrate 0, a second active layer (including a fifth active sub-portion 62) at a side of the first buffer layer 08 facing away from the base substrate 0, a first gate insulating layer (including an insulating portion 0102) at a side of the second active layer facing away from the base substrate, a fourth conductive layer (including a first conductive sub-portion 721, a seventh extending portion 747 and a second conductive sub-portion 722) at a side of the first gate insulating layer facing away from the base substrate, a second dielectric layer 012 at a side of the fourth conductive layer facing away from the base substrate, a second conductive layer (including a second conductive portion 22 and a power line 26) at a side of the second dielectric layer 012 facing away from the base substrate, a passivation layer 014 at a side of the second conductive layer facing away from the base substrate, a first flat layer 015 at a side of the passivation layer 014 facing away from the base substrate, a third conductive layer (including a fifth conductive portion 35) at a side of the first flat layer 015 facing away from the base substrate, and a second flat layer 19 at a side of the third conductive layer facing away from the base substrate. The third active portion 53 is configured to form a channel region of the driving transistor DT, and the fifth active sub-portion 62 is configured to form a channel region of the second transistor T2. The second conductive portion 22 is connected with the first conductive portion 13 through a via hole 87.

The first buffer layer 08 may be provided with a groove 411, and an orthographic projection of the groove 411 on the base substrate is at least partially overlapped with an orthographic projection of the first conductive portion 13 on the base substrate. The first conductive sub-portion 721 is located at the bottom of the groove 411, and an orthographic projection of the first conductive sub-portion 721 on the base substrate 0 is at least partially overlapped with the orthographic projection of the first conductive portion 13 on the base substrate. The second conductive sub-portion 722 may be located outside the groove 411, that is, an orthographic projection of the second conductive sub-portion 722 on the base substrate does not intersect with the orthographic projection of the groove 411 on the base substrate.

The array substrate provided by this exemplary embodiment is provided with a groove 411 on the first buffer layer 08, and a first conductive sub-portion 721 is provided at the bottom of the groove 411. The arrangement of the groove 411 reduces a distance between the first conductive sub-portion 721 and the first conductive portion 13, so that the first conductive sub-portion 721 and the first conductive portion 13 may form two electrodes of the capacitor C. In this exemplary embodiment, it is not necessary to provide the second conductive portion 22 with a large area in the related art as a capacitor electrode, so that the noise influence of the external signal on the gate electrode of the driving transistor can be reduced.

A ratio of an area of the orthographic projection of the second conductive portion 22 on the base substrate 0 to an area of the orthographic projection of the first conductive portion 13 on the base substrate may be 4%-25%. For example, the ratio of the area of the orthographic projection of the second conductive portion 22 on the base substrate 0 to the area of the orthographic projection of the first conductive portion 13 on the base substrate may be any one of 4%, 8%, 10%, 12%, 15%, 20% and 25%.

In this exemplary embodiment, a ratio of the area of the orthographic projection of the second conductive portion 22 on the base substrate 0 to an area of an orthographic projection of the via hole 87 on the base substrate may be 1-2.5, for example, the ratio of the area of the orthographic projection of the second conductive portion 22 on the base substrate 0 to the area of the orthographic projection of the via hole 87 on the base substrate may be 1, 1.2, 1.5, 2.0, 2.5, or the like. It should be understood that in other exemplary embodiments, due to some reasons such as process errors, the area of the orthographic projection of the second conductive portion 22 on the base substrate 0 may also be slightly smaller than the area of the orthographic projection of the via hole 87 on the base substrate.

In this exemplary embodiment, as shown in TABLE 2 below, TABLE 2 shows data signal voltages required by driving transistors DT with different sizes under different brightness in LTPO technology and data signal voltages required by driving transistors DT with different sizes under different brightness in LPTS (each of the transistors in the pixel driving circuit is a low temperature polysilicon transistor) technology, wherein the DT size represents a width-length ratio of the DT channel region of the driving transistor; I represents an output current of the driving transistor; Vdata represents a data signal voltage; R255 (super bright), R255 (outdoor), R255 (indoor) and R0 represent different brightness of red pixel units; G255 (super bright), G255 (outdoor), G255 (indoor) and G0 represent different brightness of green pixel units; B255 (super bright), B255 (outdoor), B255 (indoor) and B0 represent different brightness of blue pixel units; DR represents a driving voltage interval, that is, a difference between the data signal voltage at the maximum brightness and the data signal voltage at the minimum brightness.

TABLE 2

|  | I (nA) | LTPO Vdata (V) | | | | LPTS Vdata (V) |
| --- | --- | --- | --- | --- | --- | --- |
| DT size |  | 3.5/20 | 3.5/25 | 3.5/30 | 3.5/35 | 3.5/40 | 3.5/40 |
| R255 (super bright) | 100 | 3.4 | 3.35 | 3.3 | 3.2 | 3.15 | 2.65 |
| R255 (outdoor) | 60 | 3.8 | 3.75 | 3.7 | 3.68 | 3.65 | 3.1 |
| R255 (indoor) | 40 | 4 | 4 | 3.97 | 3.95 | 3.95 | 3.4 |
| R0 | 0.01 | 6.3 | 6.35 | 6.4 | 6.4 | 6.45 | 6 |
| DR |  | 2.9 | 3 | 3.1 | 3.2 | 3.3 | 3.35 |
| G255 (super bright) | 75 | 3.69 | 3.64 | 3.6 | 3.55 | 3.5 | 3 |
| G255 (outdoor) | 45 | 3.97 | 3.95 | 3.92 | 3.9 | 3.9 | 3.35 |
| G255 (indoor) | 30 | 4.16 | 4.15 | 4.15 | 4.2 | 4.1 | 3.6 |
| G0 | 00.1 | 6.3 | 6.35 | 6.4 | 6.41 | 6.45 | 6 |
| DR |  | 2.61 | 2.71 | 2.8 | 2.86 | 2.95 | 3 |
| B255 (super bright) | 175 | 3.1 | 3.05 | 2.95 | 2.85 | 2.8 | 2.25 |
| B255 (outdoor) | 105 | 3.5 | 3.4 | 3.4 | 3.3 | 3.3 | 2.75 |
| B255 (indoor) | 70 | 3.7 | 3.7 | 3.65 | 3.6 | 3.6 | 3.1 |
| R0 | 0.01 | 6.35 | 6.35 | 6.4 | 6.45 | 6.45 | 6 |
| DR |  | 3.25 | 3.3 | 3.45 | 3.6 | 3.65 | 3.75 |

It can be seen from TABLE 2 that the data signal voltage required by the driving transistor DT in the LTPO technology is greater than that required by the driving transistor in the LTPS technology under the same size and brightness state. The table verifies that the second transistor in the LTPO technology will pull down a gate voltage of the driving transistor after the compensation stage ends, so that the pixel unit requires a higher data signal voltage when displaying with the same brightness. In the prior art, a limit value of the output voltage of the source driving circuit is 6V. It can be seen from TABLE 2 that in the LTPO technology, when the brightness is R0 (e.g., no light is emitted), the data signal voltage required by the driving transistor is already greater than 6V, so that the display panel formed by the LTPO technology cannot normally be in R0 brightness.

It can be seen from TABLE 1 and TABLE 2 that when the parasitic capacitance C is 5fF, the first gate line may pull up the first conductive portion by 0.5V, so that in the TPO technology, when the brightness is R0 (e.g., no light is emitted), the data signal voltage required by the driving transistor is within 6V.

In addition, it can be seen from TABLE 2 that a R pixel unit, a G pixel unit and a B pixel unit have different driving voltage intervals. The source driving circuit is required to provide data signals with different driving voltage intervals to the R pixel unit, the G pixel unit and the B pixel unit, and the source driving circuit is required to switch between different driving voltage intervals, therefore the source driving circuit is required to consume more power. In this exemplary embodiment, the array substrate may include a R pixel driving circuit, a G pixel driving circuit and a B pixel driving circuit. A width-length ratio of a channel region of the driving transistor in the R pixel driving circuit, a width-length ratio of a channel region of the driving transistor in the B pixel driving circuit and a width-length ratio of a channel region of the driving transistor in the G pixel driving circuit are not all the same. That is, in the R pixel driving circuit, the G pixel driving circuit and the B pixel driving circuit, the width-length ratio of the channel region of the driving transistor in at least one of the pixel driving circuits is not equal to the width-length ratio of the channel region of the driving transistor in other pixel driving circuits. For example, the width-length ratio of the channel region of the driving transistor in the R pixel driving circuit may be 3.5/40, and the width-length ratio of the channel region of the driving transistor in the B pixel driving circuit can be 3.5/25. Combined with TABLE 2, it can be seen, compared with the case in which the channel region of the driving transistor in the R pixel driving circuit, the channel region of the driving transistor in the B pixel driving circuit and the channel region of the driving transistor in the R pixel driving circuit have the same width-length ratio, this arrangement can reduce the difference of the driving voltages among the R pixel unit, the G pixel unit and the B pixel unit, thus reducing the power consumption of the source driving circuit.

As shown in FIG. 8 and FIG. 19, the channel region of the driving transistor in the B pixel unit is Z-shaped, and the channel region of the driving transistor in the R pixel unit and the channel region of the driving transistor in the G pixel unit are S-shaped. The width-length ratio of the channel region of the driving transistor in the B pixel unit is smaller than the width-length ratio of the channel region of the driving transistor in the R pixel unit and the width-length ratio of the channel region of the driving transistor in the G pixel unit.

This exemplary embodiment also provides a display device, wherein the display device may include the array substrate described above. The display device may be a display device such as a mobile phone, a tablet computer, a television, or the like.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An array substrate comprising:
a pixel driving circuit and a data line, wherein the pixel driving circuit comprises a driving transistor, a first transistor connected between a first electrode of the driving transistor and the data line, a second transistor connected between a gate electrode and a second electrode of the driving transistor, the driving transistor and the first transistor are P-type transistors, and the second transistor is a N-type transistor; and
a base substrate and a first conductive layer arranged at a side of the base substrate, the base substrate comprising:
a first conductive portion for forming the gate electrode of the driving transistor;
a first gate line at a side of the first conductive portion, a part of the first gate line being configured to form a gate electrode of the first transistor; and
a second gate line at a side of the first gate line away from the first conductive portion, a part of the second gate line being configured to form a first gate electrode of the second transistor.

2. The array substrate according to claim 1, wherein: the first gate line is at a side of the first conductive portion in a first direction and extends along a second direction, the first direction and the second direction intersect with each other, and the first gate line comprises:
a first extending portion, an orthographic projection of the first extending portion on the base substrate being opposite to an orthographic projection of at least a part of the first conductive portion on the base substrate in the first direction; and
a second extending portion, an orthographic projection of the second extending portion on the base substrate being offset from an orthographic projection of the first conductive portion on the base substrate in the first direction.

3. The array substrate according to claim 2, wherein a distance between the orthographic projection of the first extending portion on the base substrate and the orthographic projection of the first conductive portion on the base substrate in the first direction is smaller than a distance between the orthographic projection of the second extending portion on the base substrate and the orthographic projection of the first conductive portion on the base substrate in the first direction.

4. The array substrate according to claim 3, wherein the first extending portion comprises a third edge at a side facing the first conductive portion, the first conductive portion comprises a fourth edge at a side facing the first extending portion, and a size of an orthographic projection of the third edge on the base substrate in the second direction is equal to a size of an orthographic projection of the fourth edge on the base substrate in the second direction.

5. The array substrate according to claim 3, wherein at least a part of the second extending portion is configured to form the gate electrode of the first transistor.

6. The array substrate according to claim 3, wherein:
the array substrate comprises a plurality of pixel driving circuits, the first conductive layer comprises a plurality of first conductive portions distributed at intervals along the second direction, and the plurality of first conductive portions are configured to respectively form gate electrodes of driving transistors in different pixel driving circuits; and
the first gate line comprises:
a plurality of first extending portions arranged corresponding to the first conductive portions one by one, an orthographic projection of one of the first extending portions on the base substrate being opposite to at least a part of an orthographic projection of a corresponding one of the first conductive portions on the base substrate in the first direction; and
a plurality of second extending portions connected between adjacent first extending portions.

7. The array substrate according to claim 2, wherein the array substrate further comprises a second conductive layer arranged at a side of the first conductive layer facing away from the base substrate, the second conductive layer comprising:
a second conductive portion, an orthographic projection of the second conductive portion on the base substrate being at least partially overlapped with the orthographic projection of the first conductive portion on the base substrate, and the second conductive portion being electrically connected with the first conductive portion through a via hole;
a third conductive portion for forming a first electrode of the second transistor, an orthographic projection of the first gate line on the base substrate being between the orthographic projection of the second conductive portion on the base substrate and an orthographic projection of the third conductive portion on the base substrate; and
a first conductive line connected between the second conductive portion and the third conductive portion, an orthographic projection of the first conductive line on the base substrate intersecting with the orthographic projection of the first gate line on the base substrate.

8. The array substrate according to claim 7, wherein:
the second conductive layer further comprises a fourth conductive portion connected with the first conductive line, an orthographic projection of the fourth conductive portion on the base substrate being at least partially overlapped with the orthographic projection of the first gate line on the base substrate; and
the fourth conductive portion comprises a first edge, the first conductive line comprises a second edge connected with the first edge of the fourth conductive portion, and an angle between an orthographic projection of the first edge on the base substrate and an orthographic projection of the second edge on the base substrate is less than 180 degrees.

9. The array substrate according to claim 7, wherein:
an orthographic projection of the second gate line on the base substrate is between the orthographic projection of the first gate line on the base substrate and the orthographic projection of the third conductive portion on the base substrate;
the second gate line comprises a third extending portion and a fourth extending portion which are sequentially and alternately connected in the second direction, and a size of an orthographic projection of the third extending portion on the base substrate in the first direction is smaller than a size of an orthographic projection of the fourth extending portion on the base substrate in the first direction; and
the orthographic projection of the first conductive line on the base substrate intersects with the orthographic projection of the third extending portion on the base substrate.

10. The array substrate according to claim 7, wherein:
the second conductive layer further comprises a power line extending along the first direction; and
the array substrate further comprises a third conductive layer arranged at a side of the second conductive layer facing away from the base substrate.

11. The array substrate according to claim 10, wherein:
the power line comprises a fifth extending portion, wherein an orthographic projection of the fifth extending portion on the base substrate is opposite to the orthographic projection of at least a part of the first conductive portion on the base substrate in the second direction, and
the third conductive layer comprises the data line extending along the first direction, wherein an orthographic projection of a part of the data line on the base substrate is on the orthographic projection of the fifth extending portion on the base substrate.

12. The array substrate according to claim 10, wherein the third conductive layer comprises:
a fifth conductive portion connected to the power line through a via hole, an orthographic projection of the fifth conductive portion on the base substrate covering the orthographic projection of the first conductive portion on the base substrate, and the orthographic projection of the fifth conductive portion on the base substrate covering the orthographic projection of the second conductive portion on the base substrate.

13. The array substrate according to claim 10, wherein:
the array substrate further comprises a third transistor, a first electrode of the third transistor is connected with the gate electrode of the driving transistor, and the second transistor and the third transistor are N-type metal oxide transistors;
the first conductive layer further comprises a third gate line at a side of the second gate line away from the first conductive portion and extending along the second direction, a part of the third gate line being configured to form a gate electrode of the third transistor; and
the third conductive layer further comprises a fifth conductive portion connected to the power line through a via hole, an orthographic projection of the fifth conductive portion on the base substrate covering an orthographic projection of the second transistor on the base substrate and an orthographic projection of the third transistor on the base substrate.

14. The array substrate according to claim 1, wherein:
the array substrate comprises a R pixel driving circuit, a G pixel driving circuit, and a B pixel driving circuit; and
a width-length ratio of a channel region of the driving transistor in the R pixel driving circuit, a width-length ratio of a channel region of the driving transistor in the G pixel driving circuit, and a width-length ratio of a channel region of the driving transistor in the G pixel driving circuit are not all the same.

15. The array substrate according to claim 14, wherein the width-length ratio of the channel region of the driving transistor in the R pixel driving circuit is equal to the width-length ratio of the channel region of the driving transistor in the G pixel driving circuit, and is smaller than the width-length ratio of the channel region of the driving transistor in the R pixel driving circuit.

16. The array substrate according to claim 7, wherein the array substrate further comprises:
a fourth conductive layer laminated between the first conductive layer and the second conductive layer, the fourth conductive layer comprising:
a fourth gate line extending along the second direction, the orthographic projection of the first gate line on the base substrate being between the orthographic projection of the first conductive portion on the base substrate and an orthographic projection of the fourth gate line on the base substrate, and a part of the fourth gate line being configured to form a second gate electrode of the second transistor.

17. The array substrate according to claim 16, wherein:
the fourth gate line comprises a sixth extending portion and a seventh extending portion which are alternately and sequentially connected along the second direction;
a size of an orthographic projection of the sixth extending portion on the base substrate in the first direction is smaller than a size of an orthographic projection of the seventh extending portion on the base substrate in the first direction; and
the orthographic projection of the first conductive line on the base substrate intersects with the orthographic projection of the sixth extending portion on the base substrate.

18. The array substrate according to claim 17, wherein a part of the seventh extending portion is configured to form the second gate electrode of the second transistor.

19. The array substrate according to claim 16, wherein the array substrate further comprises:
a first active layer laminated between the base substrate and the first conductive layer, a part of the first active layer being configured to form a channel region of the driving transistor; and
a second active layer laminated between the fourth conductive layer and the first conductive layer, a part of the second active layer being configured to form a channel region of the second transistor.

20. The array substrate according to claim 1, wherein:
the array substrate further comprises an enable signal line, an initial signal line, an anode layer, a first reset signal line, a second reset signal line, and a power line, and
the pixel driving circuit further comprises:
a third transistor having a first electrode connected to the gate electrode of the driving transistor, a second electrode connected to the initial signal line, and a gate electrode connected to the second reset signal line;
a fourth transistor having a first electrode connected to the power line, a second electrode connected to the first electrode of the driving transistor, and a gate electrode connected to the enable signal line;
a fifth transistor having a first electrode connected to the second electrode of the driving transistor, a second electrode connected to the anode layer, and a gate electrode connected to the enable signal line;
a sixth transistor having a first electrode connected to the second electrode of the fifth transistor, a second electrode connected to the initial signal line, and a gate electrode connected to the first reset signal line; and
a capacitor connected between the gate electrode of the driving transistor and the power line.

\* \* \* \* \*